United States Patent
Saito et al.

(10) Patent No.: US 7,795,137 B2
(45) Date of Patent: Sep. 14, 2010

(54) MANUFACTURING METHOD OF SEMICONDUCTOR DEVICE

(75) Inventors: Toshio Saito, Akiruno (JP); Akira Otaguro, Ome (JP); Manabu Otake, Hamura (JP); Yoshiya Takahira, Musashimurayama (JP); Namio Katagiri, Hamura (JP); Nobuaki Miyakawa, Wako (JP)

(73) Assignees: Hitachi, Ltd., Tokyo (JP); Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 12/063,718

(22) PCT Filed: Aug. 25, 2006

(86) PCT No.: PCT/JP2006/316739

§ 371 (c)(1),
(2), (4) Date: Sep. 25, 2009

(87) PCT Pub. No.: WO2007/023950

PCT Pub. Date: Mar. 1, 2007

(65) Prior Publication Data

US 2010/0015797 A1    Jan. 21, 2010

(30) Foreign Application Priority Data

Aug. 26, 2005  (JP) ............................. 2005-245554

(51) Int. Cl.
*H01L 21/4763* (2006.01)

(52) U.S. Cl. .................. 438/637; 438/98; 438/119; 438/584; 438/648; 438/667; 438/675; 257/519; 257/520; 257/E21.016; 257/E21.019; 257/E21.294; 257/E21.585; 257/E21.586; 257/E23.174

(58) Field of Classification Search .................. 438/98, 438/637, 119, 584, 648, 667, 675; 257/519, 257/520, E21.016, E21.019, E21.294, E21.585, 257/E21.586, E23.174
See application file for complete search history.

(56) References Cited

U.S. PATENT DOCUMENTS 4,835,115 A * 5/1989 Eklund ....................... 438/426

(Continued)

FOREIGN PATENT DOCUMENTS

JP        04-005829        1/1992

(Continued)

OTHER PUBLICATIONS

M. Tomisaka et al., "Copper Electroplating Study for Through Silicon Chip Electrode of Three-dimensional Chip Stacking", Denso Technical Review vol. 6 No. 2 (2001) pp. 78-84.

*Primary Examiner*—Fernando L Toledo
*Assistant Examiner*—Ankush K Singal
(74) *Attorney, Agent, or Firm*—Antonelli, Terry, Stout & Kraus, LLP.

(57) ABSTRACT

When a tungsten film (43) is embedded inside of a conductive groove (4A) formed in a wafer (W2) and a silicon oxide film (36) thereon and having a high aspect ratio, film formation and etch back of the tungsten film (43) are successively performed in a chamber of the same apparatus, therefore, a film thickness of the tungsten film (43) deposited in one film formation step is made to be thin. Whereby problems, such as exfoliation of the tungsten film (43), generation of microcracks, and occurrence of warpage and cracks of the wafer (W2), are avoided.

13 Claims, 28 Drawing Sheets

U.S. PATENT DOCUMENTS

| | | | | |
|---|---|---|---|---|
| 5,100,830 | A * | 3/1992 | Morita | 438/297 |
| 5,106,777 | A * | 4/1992 | Rodder | 438/426 |
| 5,130,268 | A * | 7/1992 | Liou et al. | 438/425 |
| 5,468,676 | A * | 11/1995 | Madan | 438/426 |
| 5,565,708 | A * | 10/1996 | Ohsaki et al. | 257/764 |
| 5,677,238 | A * | 10/1997 | Gn et al. | 438/653 |
| 5,747,384 | A * | 5/1998 | Miyamoto | 438/685 |
| 5,786,270 | A * | 7/1998 | Gorrell et al. | 438/613 |
| 5,789,277 | A * | 8/1998 | Zahorik et al. | 438/95 |
| 5,854,501 | A * | 12/1998 | Kao | 257/316 |
| 5,911,857 | A * | 6/1999 | Kim | 204/192.15 |
| 5,994,181 | A * | 11/1999 | Hsieh et al. | 438/239 |
| 6,054,768 | A * | 4/2000 | Givens et al. | 257/753 |
| 6,093,966 | A * | 7/2000 | Venkatraman et al. | 257/751 |
| 6,204,550 | B1 * | 3/2001 | Wang et al. | 257/622 |
| 6,217,721 | B1 * | 4/2001 | Xu et al. | 204/192.17 |
| 6,406,972 | B2 * | 6/2002 | Norstrom et al. | 438/404 |
| 6,475,907 | B1 * | 11/2002 | Taguwa | 438/648 |
| 6,528,411 | B2 * | 3/2003 | Kakuhara | 438/627 |
| 6,649,487 | B2 * | 11/2003 | Hashimoto et al. | 438/424 |
| 6,683,000 | B2 | 1/2004 | Fukui et al. | |
| 6,770,541 | B1 * | 8/2004 | Yin et al. | 438/424 |
| 6,787,468 | B2 * | 9/2004 | Kim et al. | 438/688 |
| 6,794,272 | B2 * | 9/2004 | Turner et al. | 438/459 |
| 6,916,725 | B2 | 7/2005 | Yamaguchi | |
| 6,995,449 | B1 * | 2/2006 | Yin et al. | 257/520 |
| 7,001,825 | B2 * | 2/2006 | Halahan et al. | 438/456 |
| 7,176,128 | B2 * | 2/2007 | Ahrens et al. | 438/643 |
| 7,250,336 | B2 * | 7/2007 | Regul et al. | 438/243 |
| 7,282,444 | B2 * | 10/2007 | Tanida et al. | 438/667 |
| 7,432,196 | B2 * | 10/2008 | Tanida et al. | 438/667 |
| 2002/0137356 | A1 * | 9/2002 | Huang et al. | 438/740 |
| 2002/0163072 | A1 * | 11/2002 | Gupta et al. | 257/698 |
| 2002/0168848 | A1 * | 11/2002 | Ouyang et al. | 438/637 |
| 2003/0109102 | A1 * | 6/2003 | Kujirai et al. | 438/243 |
| 2003/0113999 | A1 * | 6/2003 | Jang et al. | 438/685 |
| 2003/0203622 | A1 * | 10/2003 | Tripathi et al. | 438/652 |
| 2003/0207562 | A1 * | 11/2003 | Faust et al. | 438/637 |
| 2005/0023702 | A1 * | 2/2005 | Nishimura et al. | 257/774 |
| 2005/0194670 | A1 * | 9/2005 | Kameyama et al. | 257/678 |
| 2006/0003536 | A1 * | 1/2006 | Kudelka | 438/386 |
| 2006/0063290 | A1 * | 3/2006 | Won | 438/28 |
| 2006/0108641 | A1 * | 5/2006 | Jong et al. | 257/371 |
| 2006/0163638 | A1 * | 7/2006 | Ito | 257/306 |
| 2007/0117382 | A1 * | 5/2007 | Koo et al. | 438/677 |

FOREIGN PATENT DOCUMENTS

| | | |
|---|---|---|
| JP | 05-029604 | 2/1993 |
| JP | 11-261000 | 9/1999 |
| JP | 2002-334967 | 11/2002 |
| JP | 2003-142484 | 5/2003 |
| JP | 2004-228392 | 8/2004 |
| JP | 2005-203785 | 7/2005 |

* cited by examiner

MANUFACTURING METHOD OF SEMICONDUCTOR DEVICE

TECHNICAL FIELD

The present invention relates to manufacturing techniques of a semiconductor device and more particularly relates to effective techniques applied to manufacturing of a semiconductor device having a three-dimensional structure.

BACKGROUND ART

A semiconductor device having a three-dimensional structure has attracted interest as an effective structure which avoids various obstacles with which a semiconductor device having a two-dimensional structure confronts, such as limits of lithography techniques, tendency of the operation speed to be saturated by increase in wiring resistance and parasitic effects, and high electrical field effects by miniaturization in element dimensions, and keeps improving the integration level by integrating three-dimensionally semiconductor elements in a stacked multi-layer structure by stacking semiconductor active layers.

Semiconductor devices having three-dimensional structures are described, for example, in Japanese Patent Application Laid-Open Publication No. 11-261000 (Patent Document 1) and Japanese Patent Application Laid-Open Publication No. 2002-334967 (Patent Document 2), and also methods of manufacturing semiconductor devices having three-dimensional structures by mutually attaching semiconductor substrates in which semiconductor elements are formed are disclosed. These documents also disclose structures in which through-electrodes called vertical mutual connection bodies or embedded connection electrodes are formed in grooves penetrating from the main surfaces to the rear surfaces of desired semiconductor substrates so that the main surfaces and the rear surfaces of the semiconductor substrates are electrically conductive each other.

FIG. 15 of "Denso Technical Review Vol. 6 No. 2 2001" (Non-Patent Document 1) discloses techniques of embedding copper (Cu) in connection holes of a semiconductor device having a three-dimensional structure by a plating method.

Although Japanese Patent Application Laid-Open Publication No. 2003-142484 (Patent Document 3) is not about a semiconductor device having a three-dimensional structure, it discloses techniques of obtaining excellent embedding characteristics free from voids by repeatedly performing deposition of a tungsten film and etch back at a plurality of times when the tungsten film is to be embedded in fine connection holes formed in an insulating film on a semiconductor substrate.

Patent Document 1: Japanese Patent Application Laid-Open Publication No. 11-261000
Patent Document 2: Japanese Patent Application Laid-Open Publication No. 2002-334967
Patent Document 3: Japanese Patent Application Laid-Open Publication No. 2003-142484
Non-Patent Document 1: Denso Technical Review Vol. 6 No. 2 2001 (FIG. 15)

DISCLOSURE OF THE INVENTION

Generally, in a manufacturing process of a semiconductor device, as a method of reducing the electrical resistance of connection holes which electrically connects the wiring of a lower layer to the wiring of an upper layer (or a wiring to a semiconductor substrate), a method in which many square connection holes having a small diameter are closely disposed is employed.

However, in a manufacturing process of a semiconductor device having a three-dimensional structure in which a plurality of chips are stacked and mutually attached, deep conductive grooves having an aspect ratio of about 20 to 30 have to be formed in a wafer, and a conductive film connecting the upper and lower chips has to be embedded therein.

When the diameter of such deep conductive grooves is made to be small, embedding of the conductive film becomes difficult, therefore, the opening area has to be increased. However, when the opening area of the conductive groove is simply increased, the film thickness (=half of the hole diameter) of the conductive film required for embedding is also increased, therefore, the stress generated in the conductive film due to variation in temperature immediately after film formation is increased. As a result, there are problems that exfoliation on the interface between the conductive film and an insulating film and that many micro-cracks are generated in the conductive film. Moreover, the wafer is warped due to the stress, and the wafer cracks in the worst case.

An object of the present invention is to provide techniques of excellent embedding a conductive film mainly composed of tungsten in conductive grooves formed in a silicon wafer with a high aspect ratio.

The above described and other objects and novel features of the present invention will be apparent from the descriptions of the present specification and the accompanying drawings.

Effects obtained by typical embodiments of the present invention disclosed in the present application will be briefly explained as follows.

One of embodiments of the present invention is that a method of manufacturing a semiconductor device having process of embedding a conductive film mainly composed of tungsten inside of a groove formed in a silicon wafer and a silicon oxide film on the silicon wafer, and the method comprises steps of (a) depositing a first titanium nitride film covering at least a surface of the silicon oxide film by a sputtering method after forming the groove in the silicon wafer and the silicon oxide film on the silicon wafer, (b) depositing a titanium film covering a surface of the first titanium nitride film and a surface of the silicon wafer exposed inside of the groove, and having a film thickness equal to or less than half of a diameter of the groove by a CVD method, (c) depositing a second titanium nitride film covering a surface of the titanium film and having a total film thickness of the second titanium nitride film and the titanium film is equal to or less than half of the diameter of the groove by a CVD method, and (d) depositing a tungsten film to be embedded inside of the groove by a CVD method after the step (c).

The effects obtained by typical embodiments of the present invention disclosed in the present specification are briefly explained as follows.

In a manufacturing process of a semiconductor device having a three-dimensional structure in which a plurality of chips are stacked and mutually attached, exfoliation of a conductive film, generation of micro-cracks, warpage and cracks of a wafer, and the like can be prevented, therefore, the manufacturing yield of the semiconductor device having the three-dimensional structure is improved.

BRIEF DESCRIPTIONS OF THE DRAWINGS

BEST MODE FOR CARRYING OUT THE INVENTION

Figure 1:
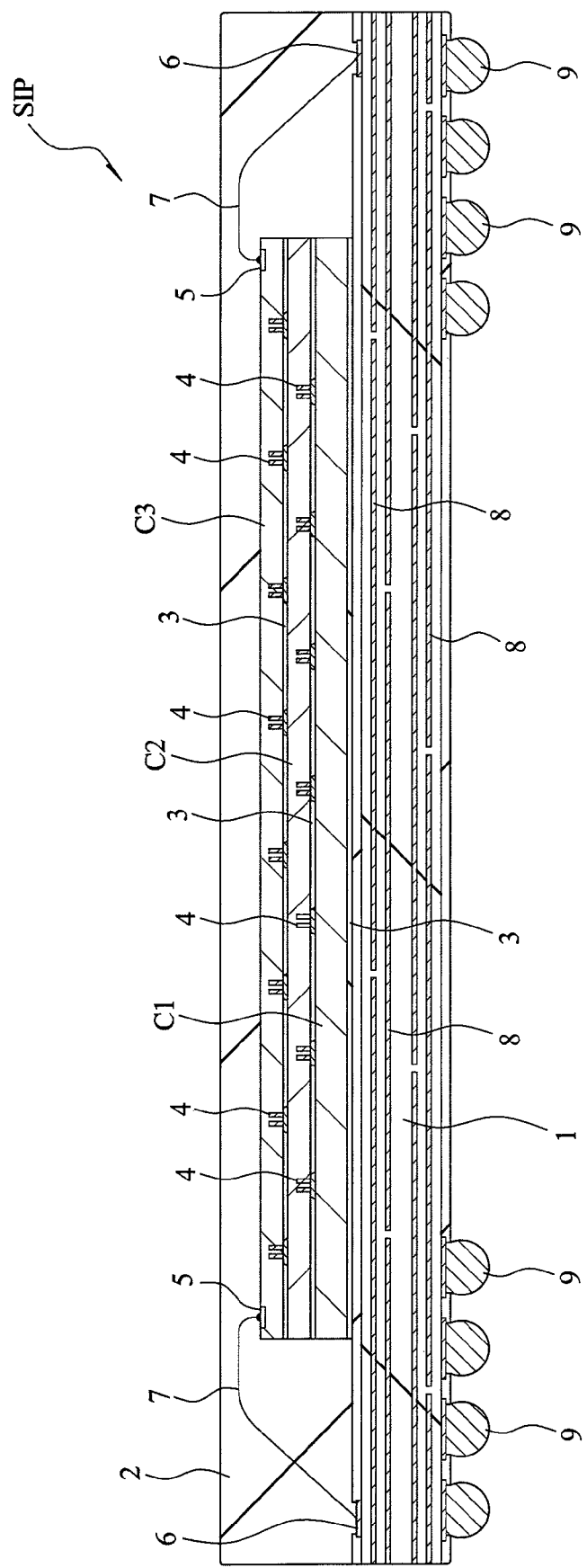
FIG. 1 is a cross sectional view showing an example of a package in which a semiconductor device is mounted on a wiring substrate and sealed with a resin according to an embodiment of the present invention.

Hereinafter, embodiments of the present invention will be described in detail with reference to the drawings. Note that, in all the drawings for explaining the embodiments, basically, same members are denoted by the same reference numerals, and repeated explanations thereof will be omitted.

A semiconductor device of the present embodiment has a three-dimensional structure in which three semiconductor chips (hereinafter, simply referred to as chips) C1, C2, and C3, which each of the chips has mutually different integrated circuits, are stacked and attached to each other. FIG. 1 is a cross sectional view showing an example of a package in which the semiconductor device is mounted on a wiring substrate 1 and sealed by a mold resin 2.

In the three chips C1, C2, and C3 mounted on the wiring substrate 1, the undermost-layer chip C1 adheres to the wiring substrate 1 via an adhesive 3. The intermediate chip C2 adheres to the chip C1 via the adhesive 3, and the uppermost-layer chip C3 adheres to the chip C2 via the adhesive 3. Although it will be described later in detail, the integrated circuits formed on the undermost-layer chip C1 and the integrated circuits formed on the intermediate-layer chip C2 are electrically connected to each other via a plurality of through holes 4 formed in the chip C2, and the integrated circuits formed on the intermediate chip C2 and the integrated circuits formed on the uppermost-layer chip C3 are electrically connected via a plurality of through holes 4 formed in the chip C3. In other words, the semiconductor device of the present embodiment realizes a desired system by mutually connecting the integrated circuits formed on the chips C1, C2, and C3 via the through holes 4.

The above described a set of chips of C1, C2, C3 and the wiring substrate 1 are mutually electrically connected via a plurality of Au wires 7 bonded between a plurality of bonding pads 5 formed on the uppermost-layer chip C3 and a plurality of electrodes 6 formed on the wiring substrate 1. The electrodes 6 are electrically connected to solder bumps 9 on the rear surface of the wiring substrate 1 via copper (Cu) wirings 8 in the wiring substrate 1. The solder bumps 9 constitute external connection terminals when the package shown in FIG. 1 is mounted on a mother board or the like.

Figure 2:
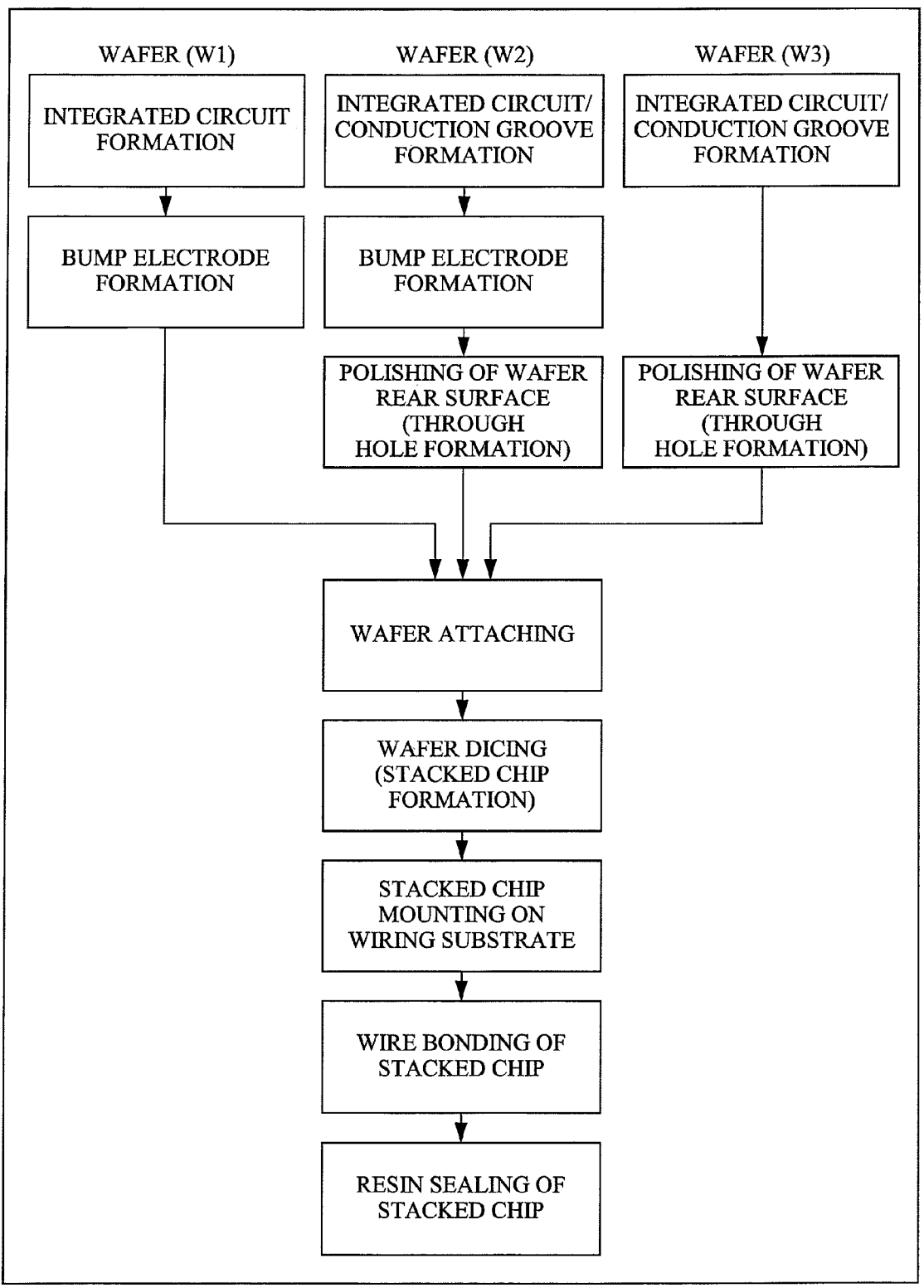
FIG. 2 is a flow chart showing manufacturing steps of the semiconductor device according to the embodiment of the present invention.

FIG. 2 is a flow chart showing manufacturing steps of the semiconductor device of the present embodiment. The manufacturing steps of the semiconductor device can be roughly separated into: a step of forming different integrated circuits on three semiconductor wafers (hereinafter, simply referred to as wafers) W1, W2, and W3 and forming conductive grooves in the two wafers W2 and W3; a step of forming bump electrodes on the wafers W1 and W2; a step of forming the through holes 4 by exposing the conductive grooves by polishing the rear surface of the wafers W2 and W3; a step of mutually attaching the wafers W1, W2, and W3 and mutually electrically connecting their integrated circuits via the through holes 4 and the bump electrodes; a step of forming the chips C1, C2, and C3 having the three-dimensional structure by dicing the wafers W1, W2, and W3; and a step of packaging (substrate packaging, wire bonding, and resin sealing) the chips C1, C2, and C3.

Hereinafter, a method of manufacturing the semiconductor device using the three wafers (W1, W2, and W3) will be explained in the order of steps. The step of forming the integrated circuits and the through holes 4 in each wafer will be explained by mainly using the wafer W2 (the wafer positioned in the middle when attached to each other).

Figure 3:
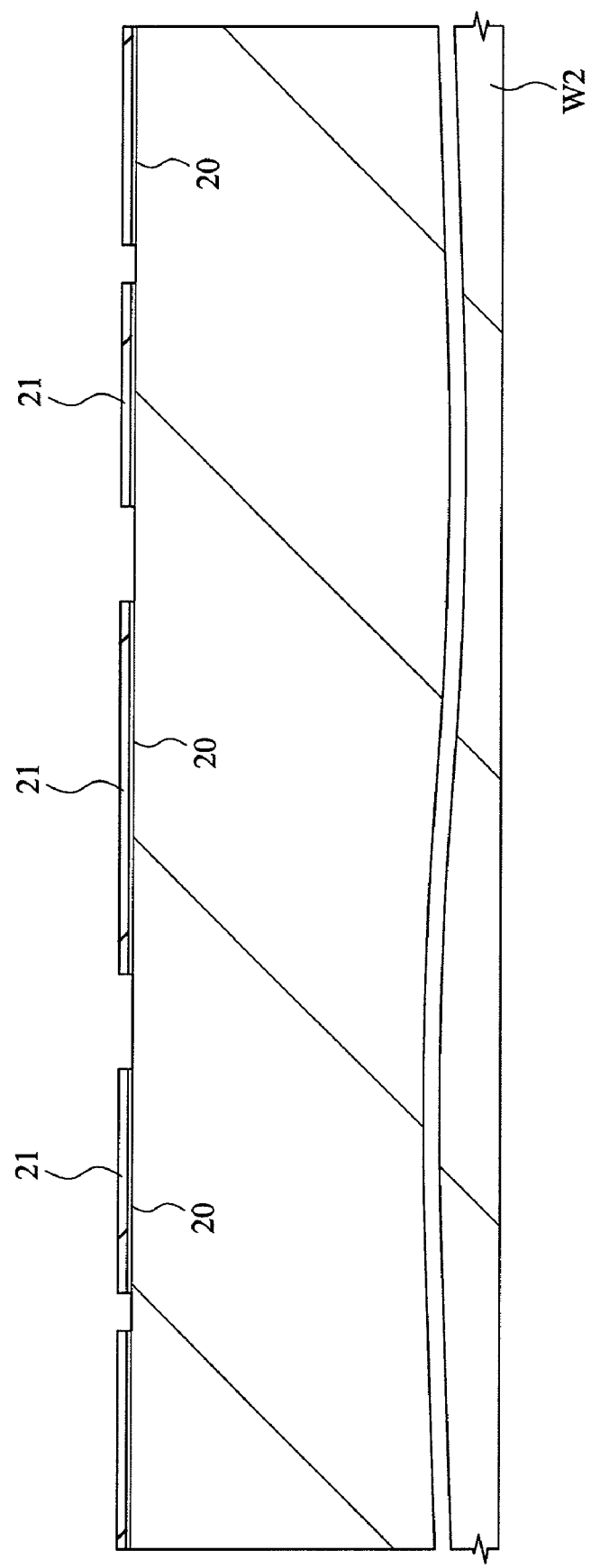
FIG. 3 is a cross sectional view of a principal part of the semiconductor wafer for showing a manufacturing step of the semiconductor device according to the embodiment of the present invention.

First of all, as shown in FIG. 3, the wafer W2 composed of single-crystal silicon and having a thickness of about 780 μm is prepared. Then, the wafer W2 is thermally treated to form a thin silicon oxide film 20 having a film thickness of about 10 nm on the main surface thereof (surface on which an integrated circuit is formed), a silicon nitride film 21 is subsequently deposited on the silicon oxide film 20 by a CVD (Chemical Vapor Deposition) method, and then, the silicon nitride film 21 and the silicon oxide film 20 at the formation regions of element isolation groove are removed by dry etching using a photo-resist film (not shown) as a mask. The silicon oxide film 20 formed between the wafer W2 and the silicon nitride film 21 is a buffer layer for reducing the stress generated on interface between the wafer W2 and the silicon nitride film 21 and preventing generation of defects such as dislocation caused by the stress on the surface of the wafer W2.

Figure 4:
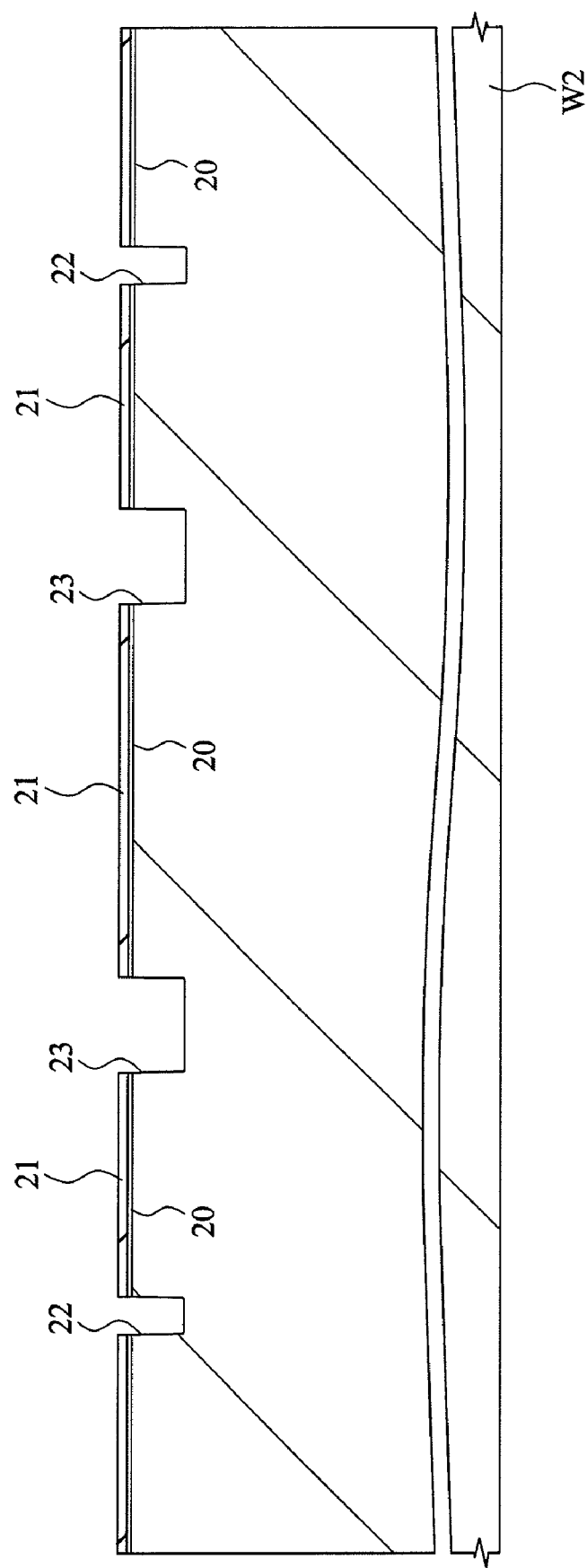
FIG. 4 is a cross sectional view of a principal part of the semiconductor wafer for showing a manufacturing step of the semiconductor device continued from FIG. 3.
Figure 5:
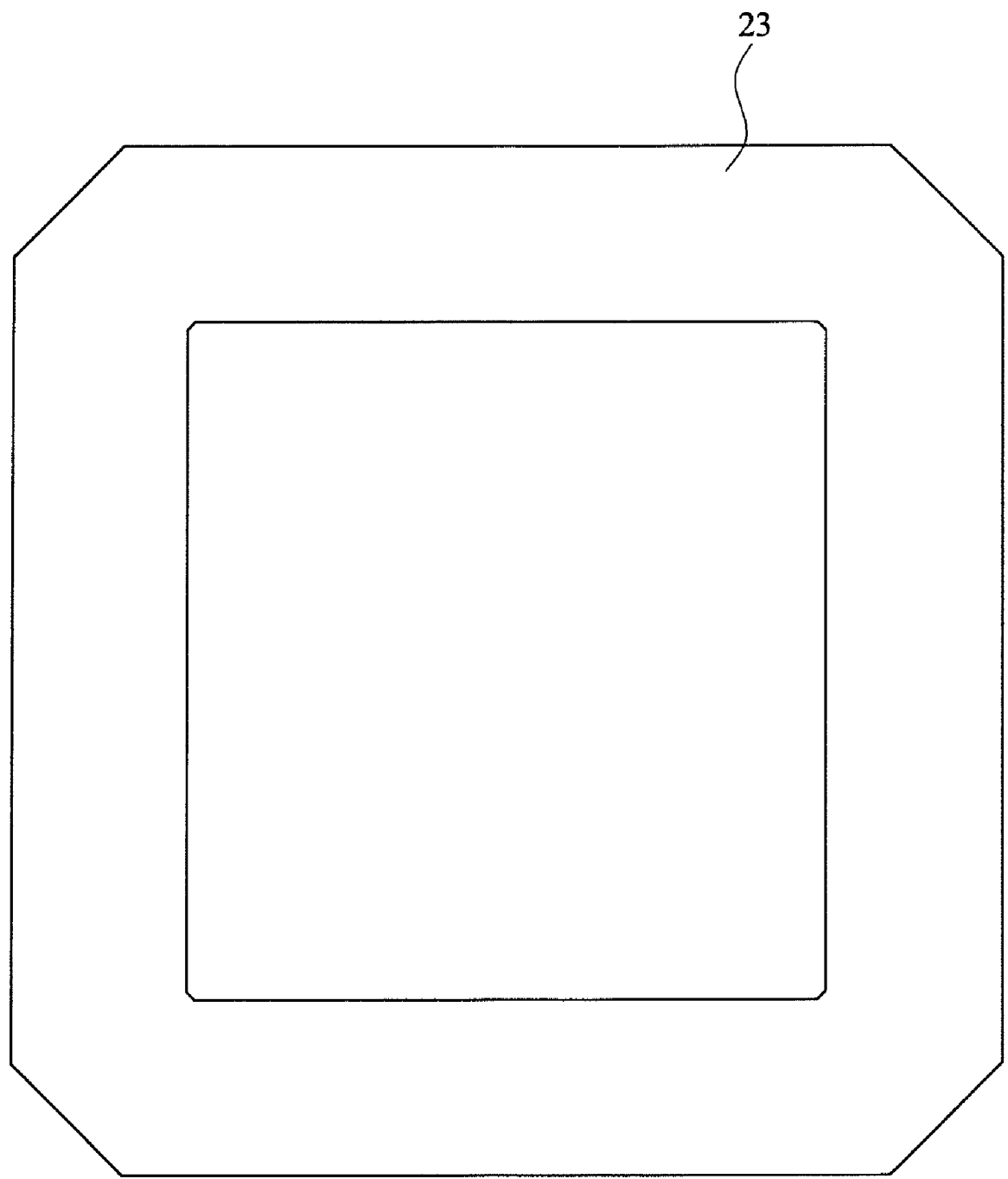
FIG. 5 is a plan view of a principal part of a semiconductor wafer showing a planar shape of a groove.

Next, as shown in FIG. 4, by dry etching using the silicon nitride film 21 as a mask, element isolation grooves 22 having a depth of about 350 nm are formed in the wafer W2 at the formation regions of the element isolation groove, and grooves 23 having a depth of about 350 nm are formed in the wafer W2 in the vicinities of the formation regions of the through holes 4 formed later. The planar shape of the groove 23 is, for example, a rectangular frame-like shape as shown in FIG. 5.

Figure 6:
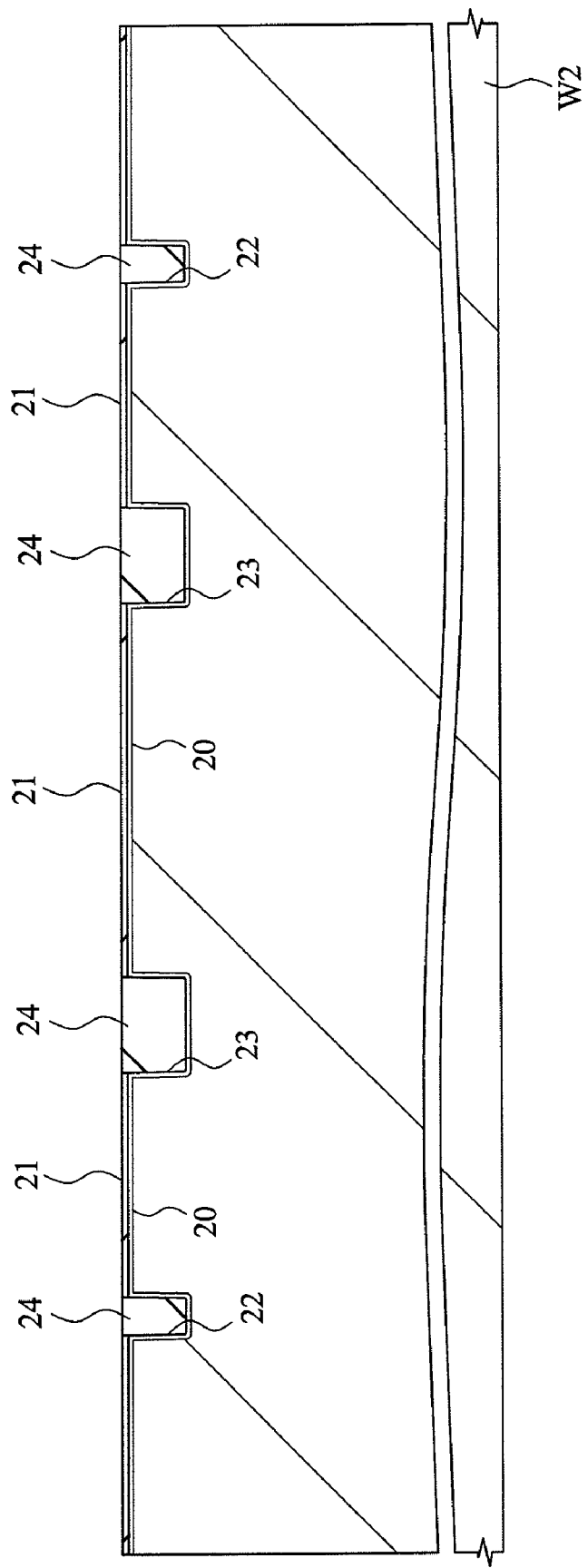
FIG. 6 is a cross sectional view of a principal part of the semiconductor wafer for showing a manufacturing step of the semiconductor device continued from FIG. 4.

Next, as shown in FIG. 6, after a silicon oxide film 24 is deposited on the wafer W2 by a CVD method, the silicon oxide film 24 outside of the element isolation grooves 22 and the grooves 23 are removed by polishing with a CMP (Chemical Mechanical Polishing) method, therefore the silicon oxide film 24 inside the element isolation groove 22 and the grooves 23 is left.

Figure 7:
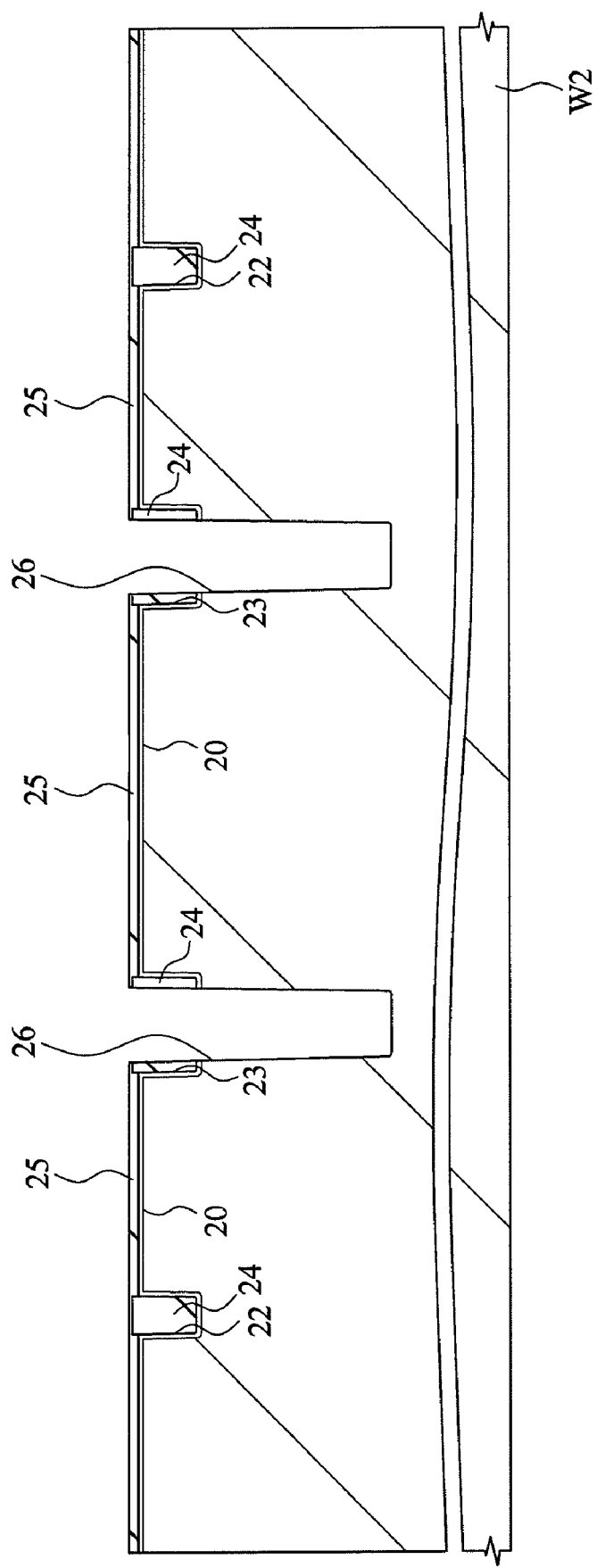
FIG. 7 is a cross sectional view of a principal part of the semiconductor wafer for showing a manufacturing step of the semiconductor device continued from FIG. 6.
Figure 8:
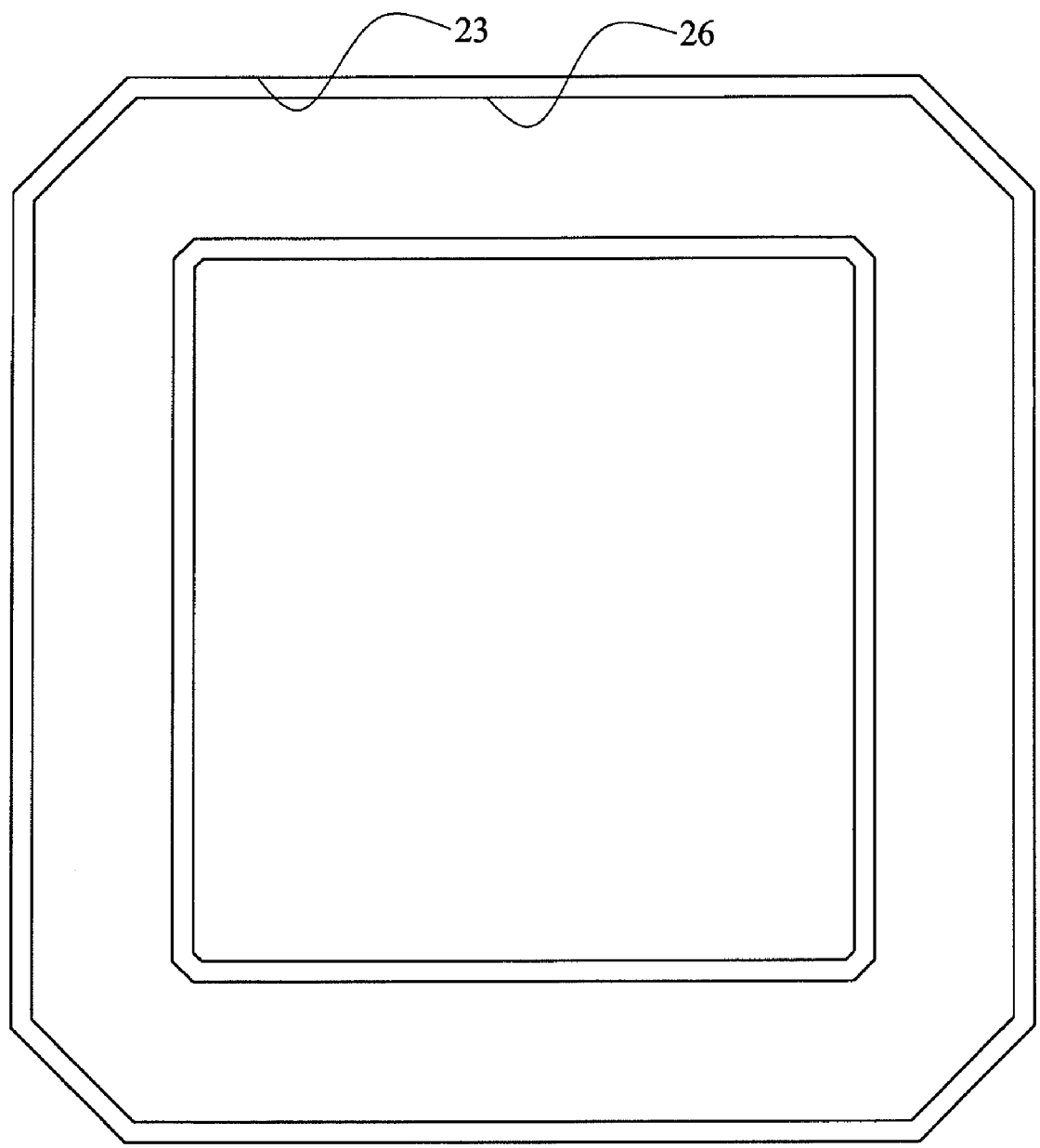
FIG. 8 is a plan view of a principal part of the semiconductor wafer showing a planar shape of an insulation groove.

Next, after the silicon nitride film 21 is removed by etching, as shown in FIG. 7, a silicon nitride film 25 is deposited on the wafer W2 by a CVD method. Subsequently, by dry etching using a photo-resist film (not shown) as a mask, the silicon nitride film 25 above the grooves 23, the silicon oxide film 24 in the grooves 23, and the wafer W2 below the grooves 23 are sequentially etched, whereby insulation grooves 26 having a depth of about 40 μm are formed in the inner parts of the grooves 23. As shown in FIG. 8, the insulation groove 26 is formed along the groove 23 and has a narrower width than that of the groove 23. The width of the insulation groove 26 is, for example, about 2 μm.

Figure 9:
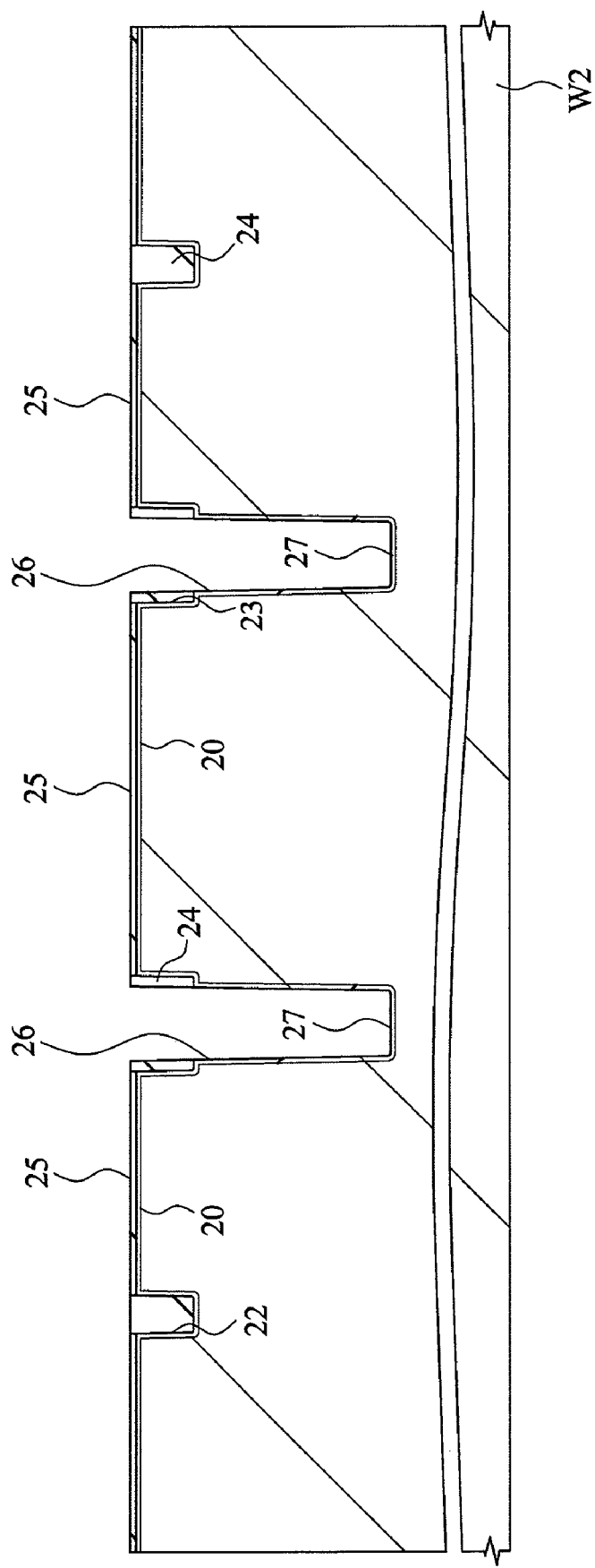
FIG. 9 is a cross sectional view of a principal part of the semiconductor wafer for showing a manufacturing step of the semiconductor device continued from FIG. 7.
Figure 10:
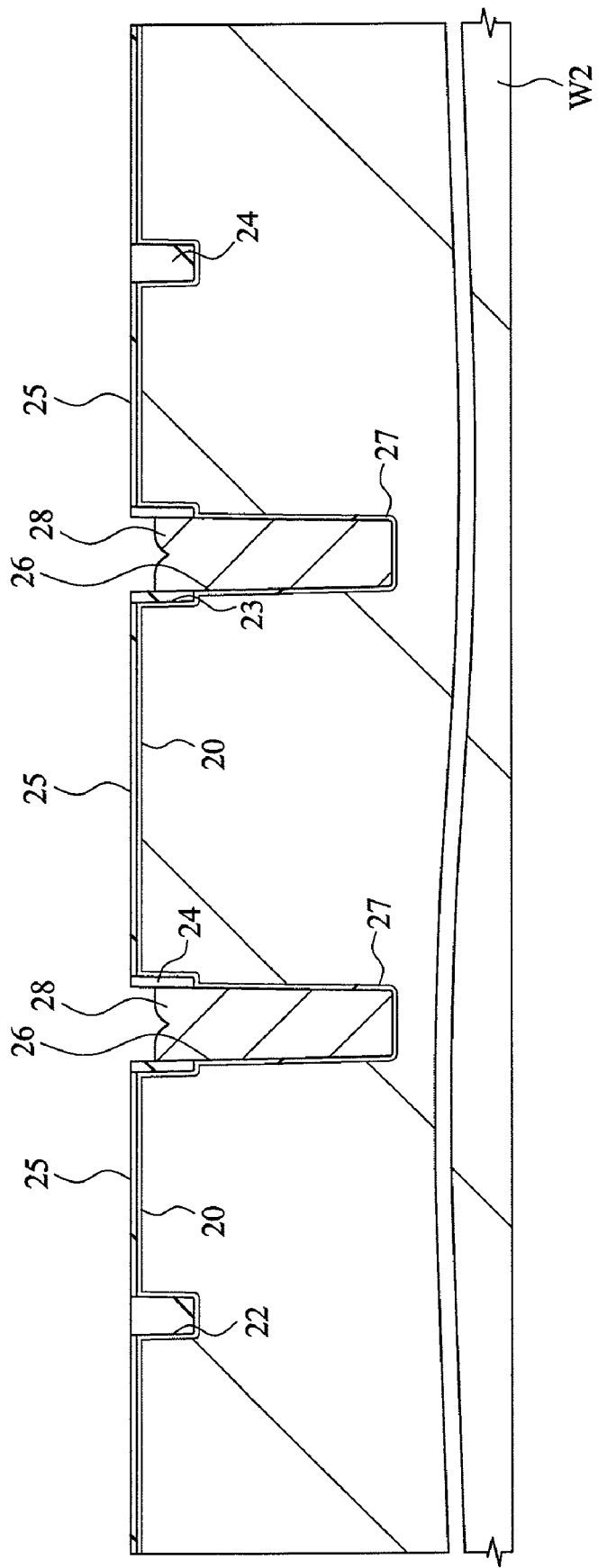
FIG. 10 is a cross sectional view of a principal part of the semiconductor wafer for showing a manufacturing step of the semiconductor device continued from FIG. 9.

Next, as shown in FIG. 9, the wafer W2 is subjected to a thermal treatment at about 1000° C. to form a silicon oxide film 27 on the inner walls of the insulation grooves 26. Subsequently, as shown in FIG. 10, after a polysilicon film 28 is deposited on the wafer W2 by a CVD method, the polysilicon films 28 outside of the insulation grooves 26 are removed by etch back, whereby the polysilicon films 28 is left in the insulation grooves 26. In this process, the height of the surface of the polysilicon films 28 in the insulation groove 26 is made to be lower than the surface of the wafer W2.

Figure 11:
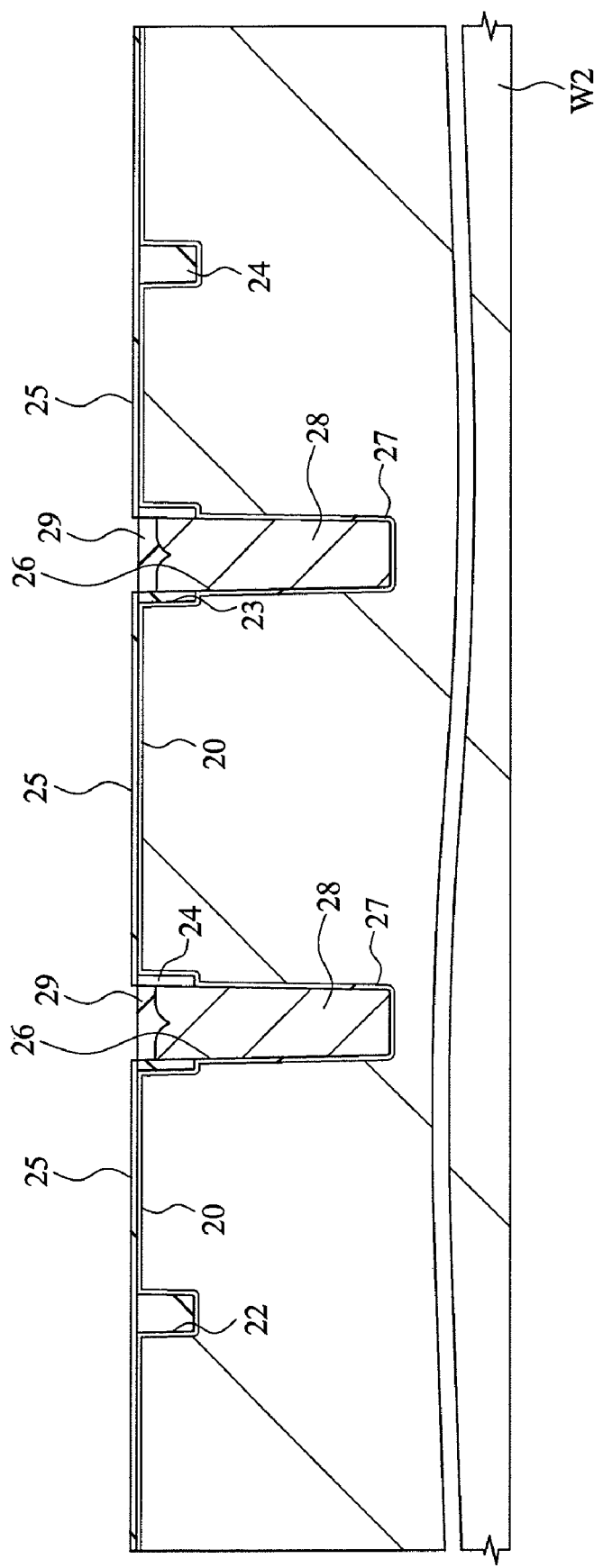
FIG. 11 is a cross sectional view of a principal part of the semiconductor wafer for showing a manufacturing step of the semiconductor device continued from FIG. 10.

Next, after a silicon oxide film is deposited on the wafer W2 by a CVD method, the silicon oxide film outside of the insulation grooves 26 is removed by polishing with a CMP method, thereby forming cap insulation films 29 composed of the silicon oxide film on the polysilicon films 28 in the insulation grooves 26 as shown in FIG. 11. Through the steps at this point, the insulation grooves 26 in which the silicon oxide film 27 and the cap-insulation film 29 surround the periphery of the polysilicon film 28 are completed. The insulation grooves 26 are formed for electrically separating integrated circuit elements, which are formed on the main surface of the wafer W2 in a later step, from the through holes 4. Since the wafer W2 is subjected to the thermal treatment at about 1000° C. when forming the silicon oxide film 27 on the inner walls of the insulation grooves 26, the insulation grooves 26 are desired to be formed prior to forming integrated circuit elements.

Figure 12:
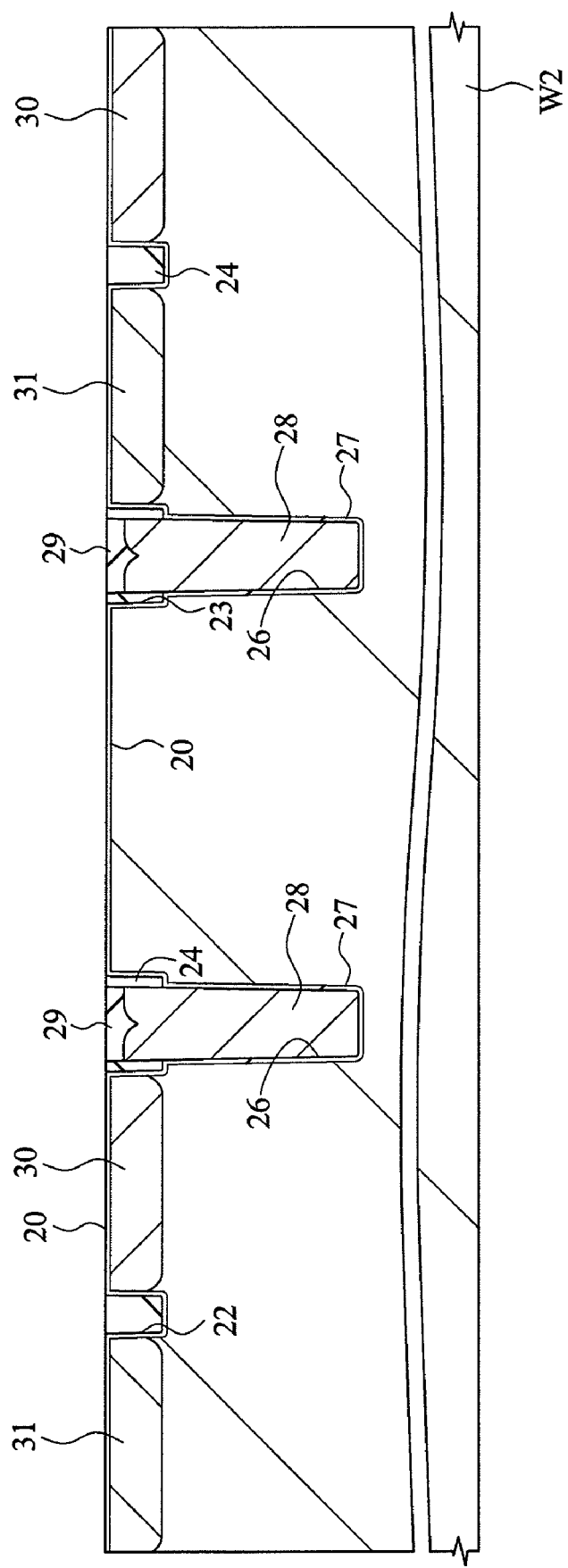
FIG. 12 is a cross sectional view of a principal part of the semiconductor wafer for showing a manufacturing step of the semiconductor device continued from FIG. 11.

Next, after the silicon nitride film 25 is removed by etching, as shown in FIG. 12, an n-type impurity and a p-type impurity are ion-implanted into the element formation regions on the wafer W2 to form n-type wells 30 and p-type wells 31.

Figure 13:
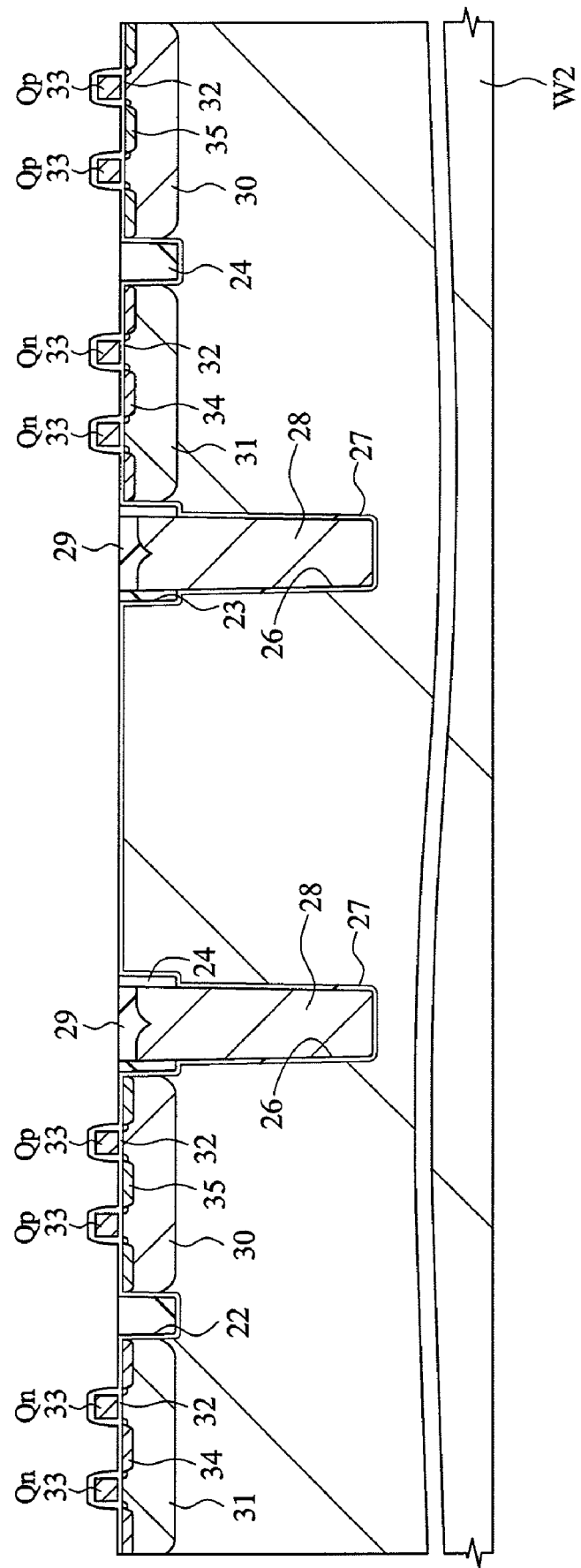
FIG. 13 is a cross sectional view of a principal part of the semiconductor wafer for showing a manufacturing step of the semiconductor device continued from FIG. 12.

Next, the silicon oxide film 20 is removed by wet etching the surface of the wafer W2. Subsequently, by performing a thermal treatment to the wafer W2, a gate oxide film 32 is formed on the surface thereof. Then, as shown in FIG. 13, in accordance with a known MOS transistor formation process, n-channel-type MOS transistors Qn are formed in the p-type wells 31, and p-channel-type MOS transistors Qp are formed in the n-type wells 30. The n-channel-type MOS transistor Qn mainly includes the gate oxide film 32, a gate electrode 33, and n-type semiconductor regions (source and drain) 34, and the p-channel-type MOS transistor Qp mainly includes the gate oxide film 32, the gate electrode 33, and p-type semiconductor regions (source and drain) 35. The gate electrode 33 is formed, for example, by depositing an n-type polysilicon film on the gate oxide film 32 by a CVD method and then patterning the n-type polysilicon silicon film by dry etching using a photo-resist film (not shown) as a mask. The n-type semiconductor regions (source and drain) 34 are formed by ion-implanting an n-type impurity (for example, phosphorus) into the p-type wells 31, and the p-type semiconductor regions (source and drain) 35 are formed by ion-implanting a p-type impurity (boron) into the n-type wells 30.

Figure 14:
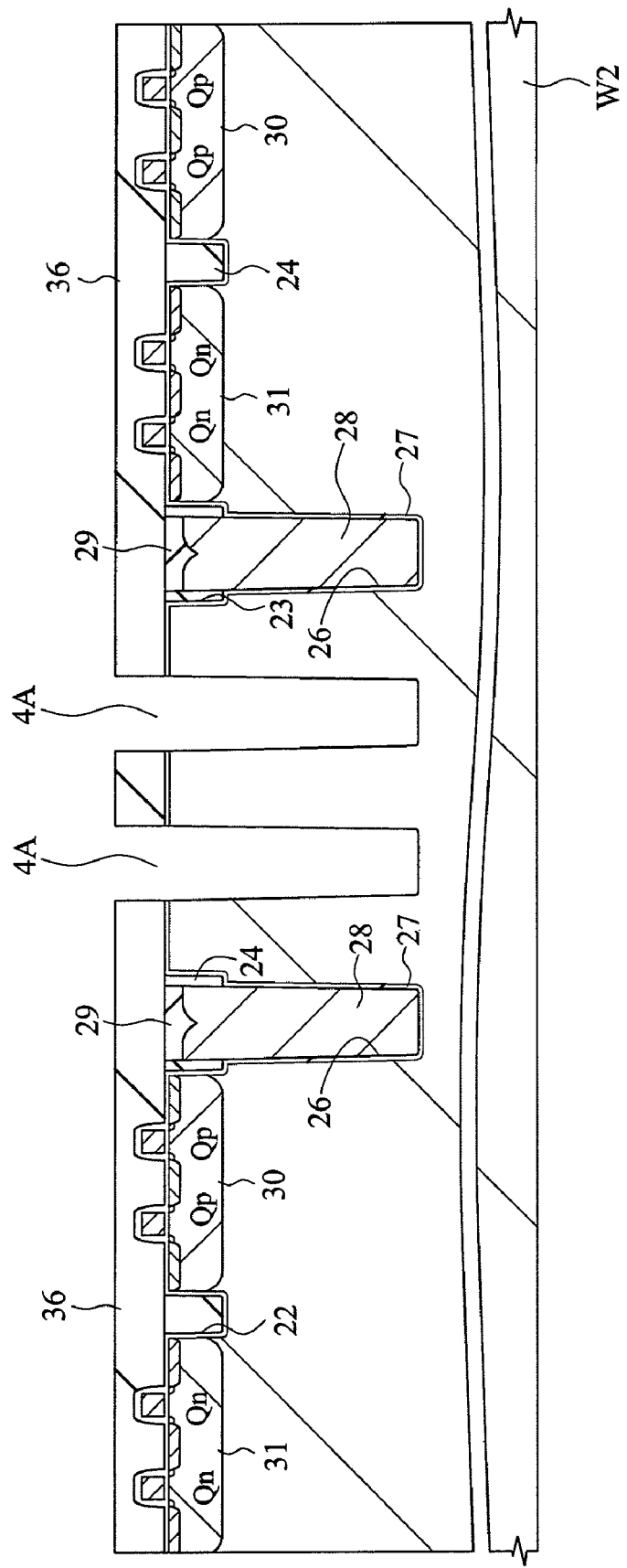
FIG. 14 is a cross sectional view of a principal part of the semiconductor wafer for showing a manufacturing step of the semiconductor device continued from FIG. 13.

Next, as shown in FIG. 14, a silicon oxide film 36 is deposited on the wafer W2 by a CVD method, and the silicon oxide film 36 is subsequently polished by CMP to planarize the surface thereof. Then, by dry etching the silicon oxide film 36 and the wafer W2 below the silicon oxide film 36 with using a photo-resist film (not shown) as a mask, conductive grooves 4A inside the insulation grooves 26 are formed. The conductive grooves 4A become the through holes 4 in later steps, and the depth thereof from the surface of the wafer W2 to the bottom of the conductive groove 4A is approximately same as that (about 40 µm) of the insulation groove 26.

Figure 15:
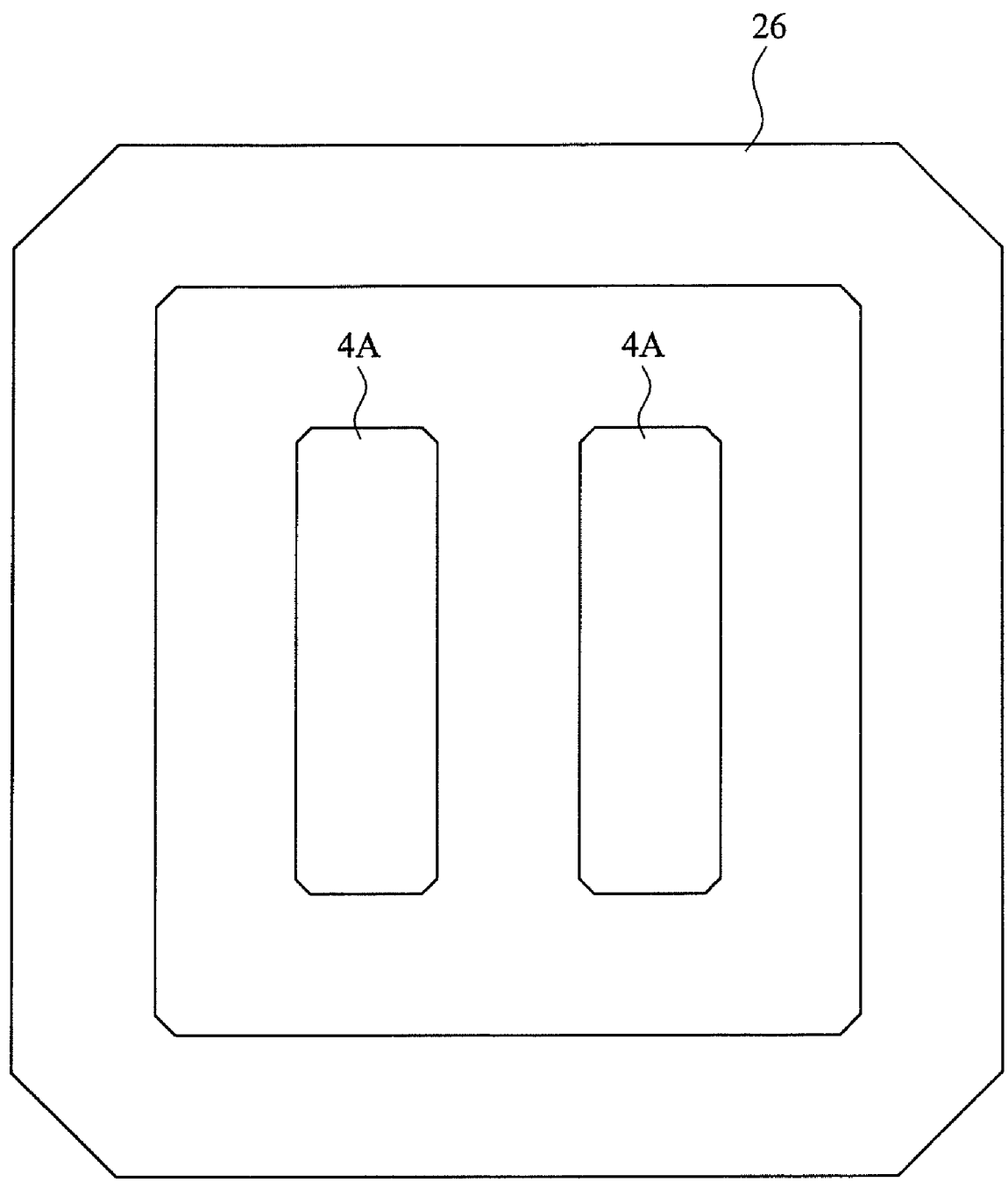
FIG. 15 is a plan view of a principal part of the semiconductor wafer showing a planar shape of a conductive groove.

As shown in FIG. 15, the planar shape of the conductive groove 4A is rectangular, and the long-side thereof is about 5.6 µm and the short-side thereof is about 1.7 µm. In this case, the aspect ratio of the conductive groove 4A to the short-side direction is larger than or equal to 20.

Several thousands of the conductive grooves 4A are formed in one chip (C2) obtained from the wafer W2. Although there is no particular limitation on this, the present embodiment employs a configuration in which two such rectangular conductive grooves 4A are arranged on the inner part of one insulation groove 26, and the two conductive grooves 4A are connected to the identical integrated circuit.

Generally, in manufacturing process of a semiconductor device, as a method of reducing the electrical resistance of a connection hole electrically connecting a lower-layer wiring with an upper-layer wiring (or a wiring with a semiconductor substrate), a method of closely disposing many square connection holes having small diameter is employed. However, in the case of the high-aspect-ratio conductive groove 4A having a depth of about 40 µm, embedding of a conductive film becomes difficult when its diameter is made to be reduced, therefore, the opening area has to be increased. However, when the opening area of the conductive groove 4A is simply increased, the film thickness (=½ of hole diameter) of the conductive film required for embedding is also increased, therefore, the stress generated in the conductive film by variation in temperature occurring immediately after film formation is increased. As a result, there are such problems that exfoliation is generated on the interface between the conductive film and the insulation film and that many microcracks are generated in the conductive film. Moreover, the wafer W2 is warped due to the stress, and the wafer W2 is cracked in the worst case.

Thus, in the present embodiment, the opening shape of the conductive groove 4A is made to be rectangular. In this case, embedding of the conductive film becomes easier compared with the case in which many square conductive grooves having small diameter are closely disposed, and moreover, the electric resistance can be reduced since the opening area is increased. Also, when the opening shape of the conductive groove 4A is made to be rectangular, the film thickness of the conductive film required for embedding is merely half of the short-side length. Therefore, since the stress generated in the film by variation in temperature occurring immediately after film formation is reduced, generation of above described problems can be suppressed.

Figure 16:
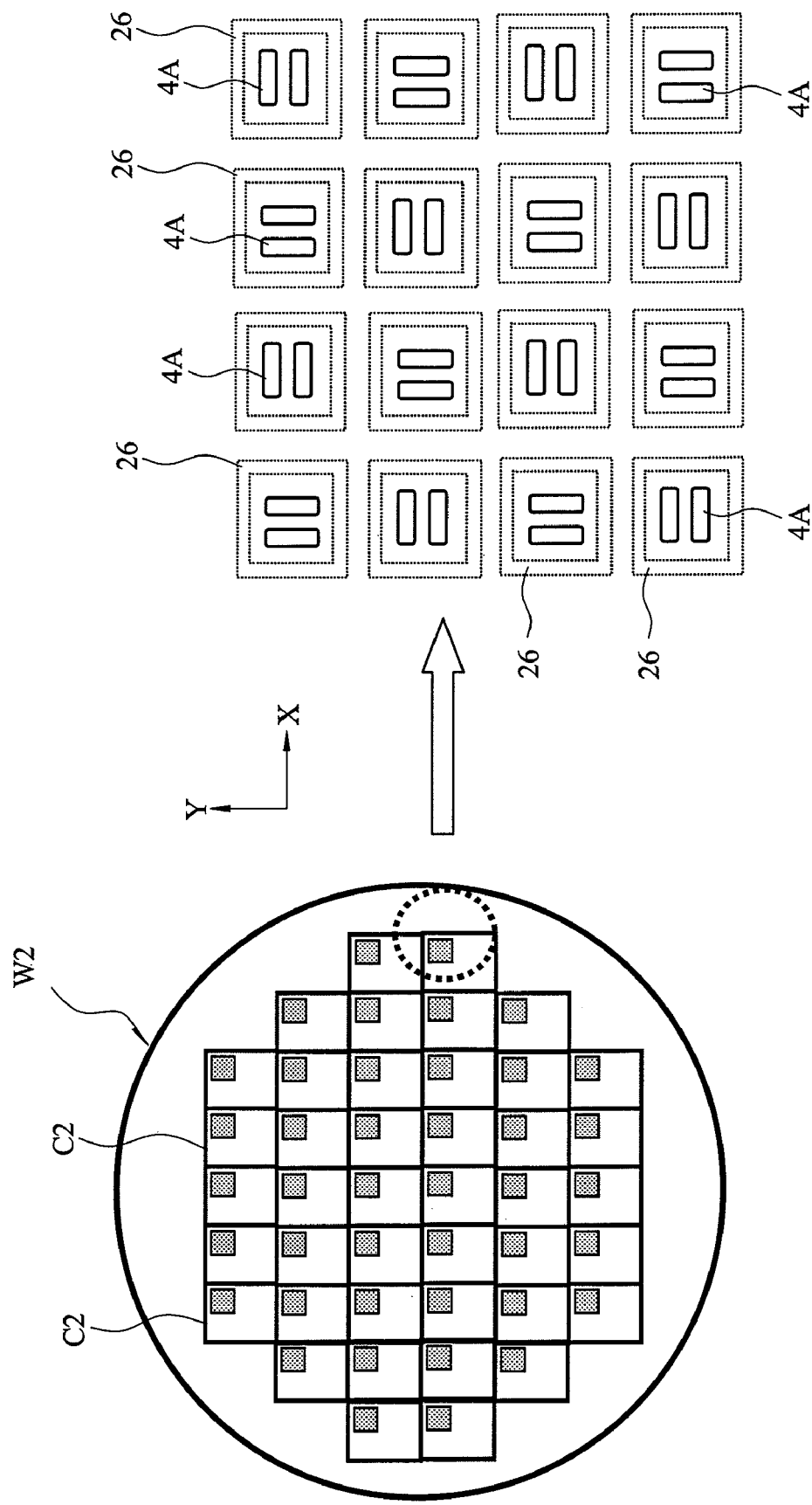
FIG. 16 is a plan view of a principal part of the semiconductor wafer showing a plan-layout of the conductive grooves.

Furthermore, in the present embodiment, as shown in FIG. 16, in the conductive grooves 4A formed in each of the chips (C2) obtained from the wafer W2, the number of the conductive grooves 4A whose long-sides are directed in a Y direction and the number of the conductive grooves 4A whose long-sides are directed in an X direction perpendicular to the Y direction are made to be approximately equal to each other. In other words, in the conductive grooves 4A formed on the entire main surface of the wafer W2, the number of the conductive grooves 4A whose long-sides are directed in the Y direction and the number of the conductive grooves 4A whose long-sides are directed in the X direction perpendicular to the Y direction are made to be approximately equal to each other.

In the case in which the opening shape of the conductive groove 4A is rectangular, when the wafer W2 returns to normal temperature after deposition of the conductive film, the amount of shrinkage of the conductive film in the conductive grooves 4A is different in the long-side direction and the short-side direction. Therefore, when all the long-sides of the conductive grooves 4A formed in the wafer W2 are directed toward the same direction (for example, the Y direction), the amount of shrinkage of the conductive film is different in the Y direction (long-side direction) and the X direction (short-side direction), therefore, the wafer W2 is warped. On the other hand, as shown in FIG. 16, when the number of the conductive grooves 4A whose long-sides are directed in the Y direction and the number of the conductive grooves 4A whose long-sides are directed in the X direction are approximately equal to each other in the entire wafer W2, the amount of shrinkage of the conductive film in the conductive grooves 4A is approximately the same in the Y direction and the X direction, therefore, the warpage of the wafer W2 can be suppressed.

Figure 17:
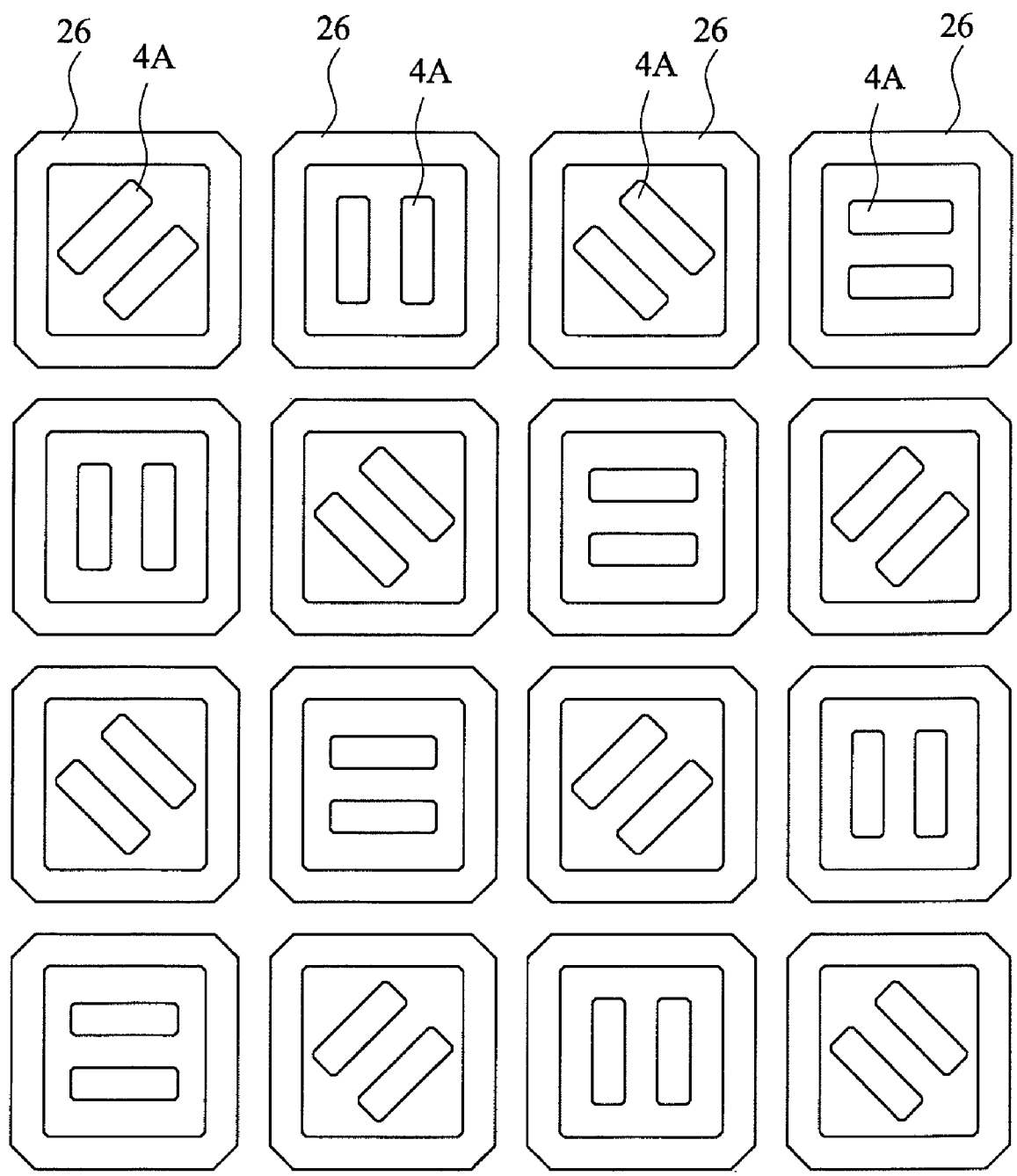
FIG. 17 is a plan view of a principal part of a semiconductor wafer showing another example of a plan-layout of conductive grooves.
Figure 18:
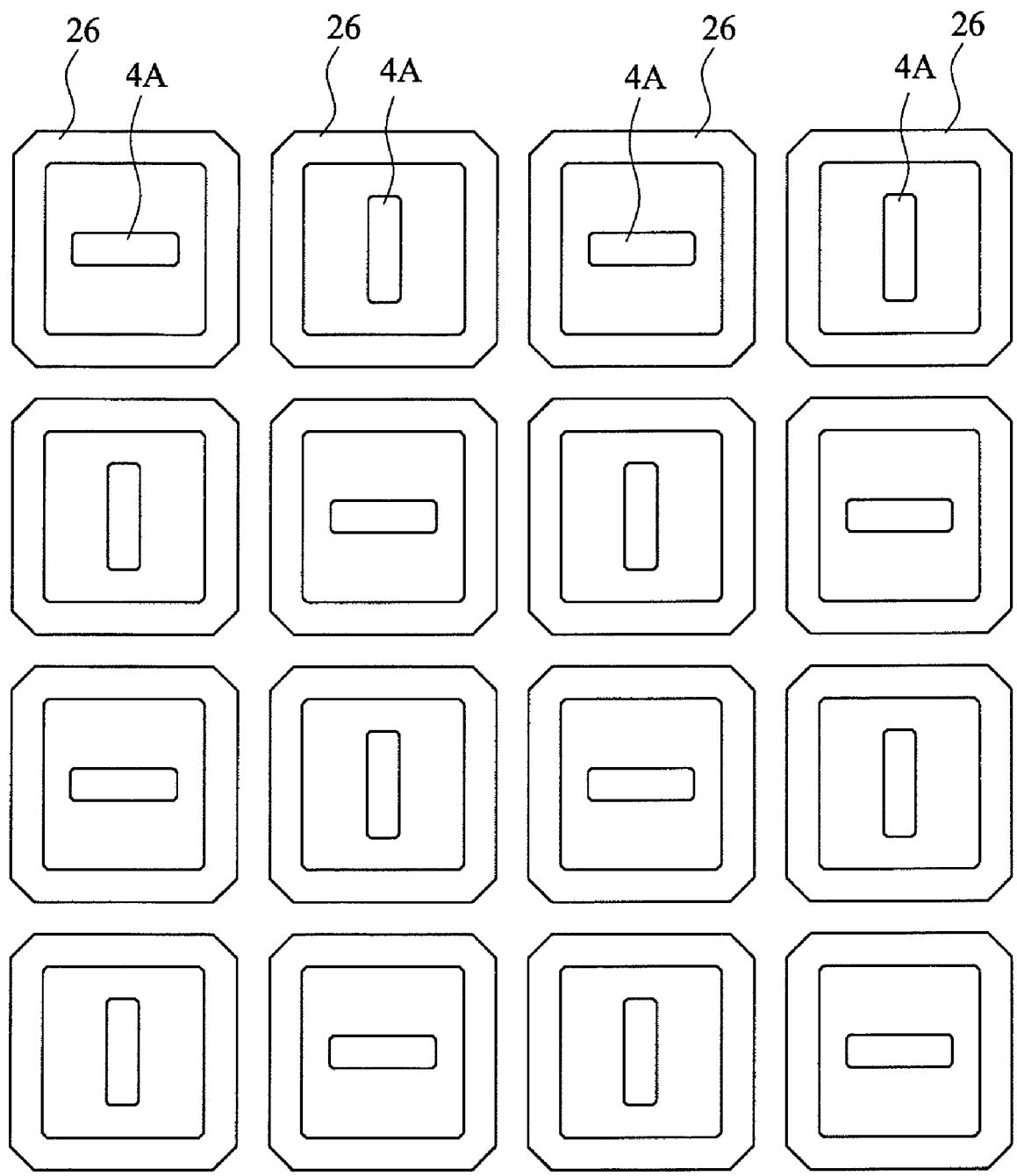
FIG. 18 is a plan view of a principal part of a semiconductor wafer showing another example of a plan-layout of conductive grooves.
Figure 19:
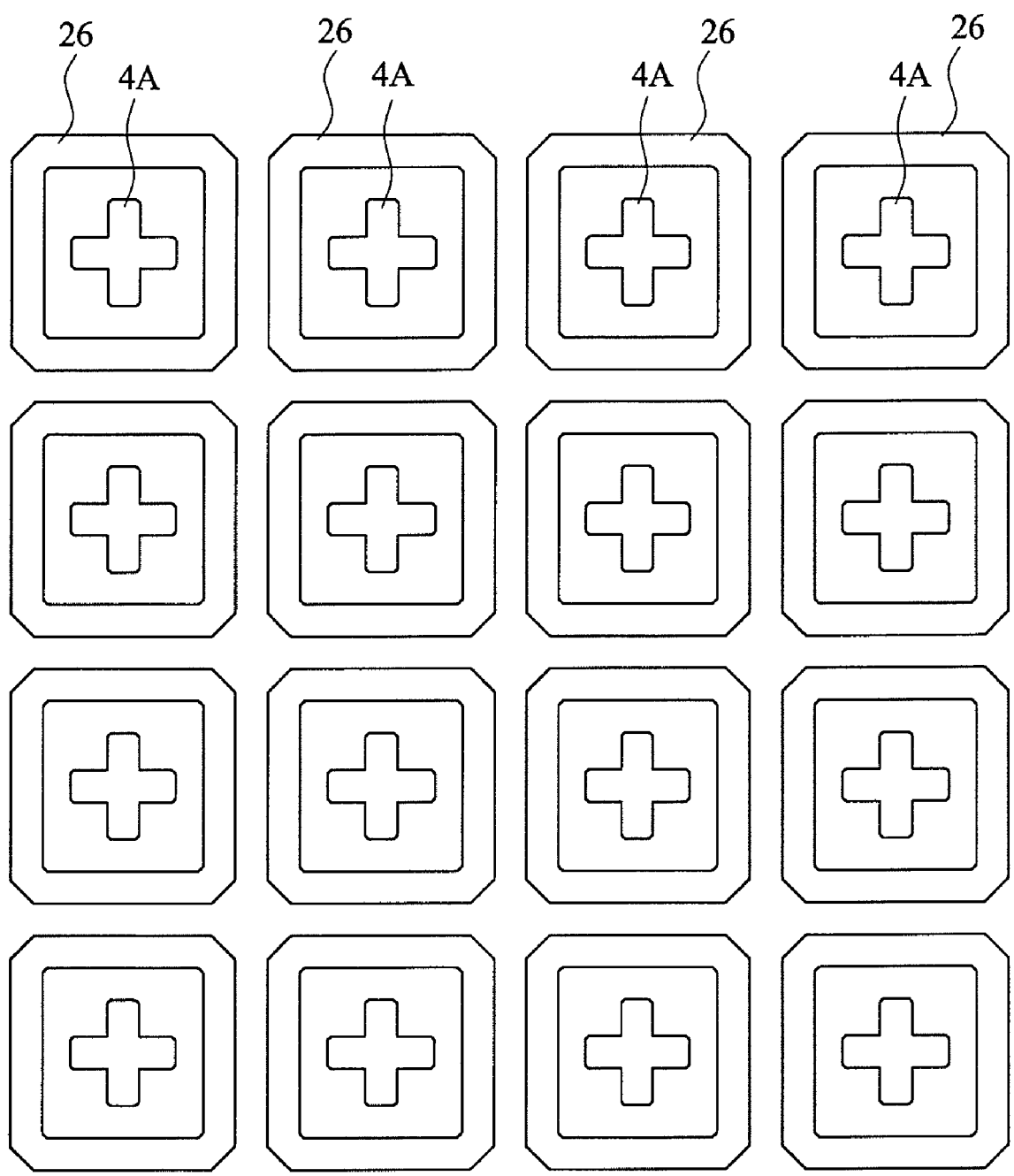
FIG. 19 is a plan view of a principal part of a semiconductor wafer showing another example of a plan-layout of conductive grooves.
Figure 20:
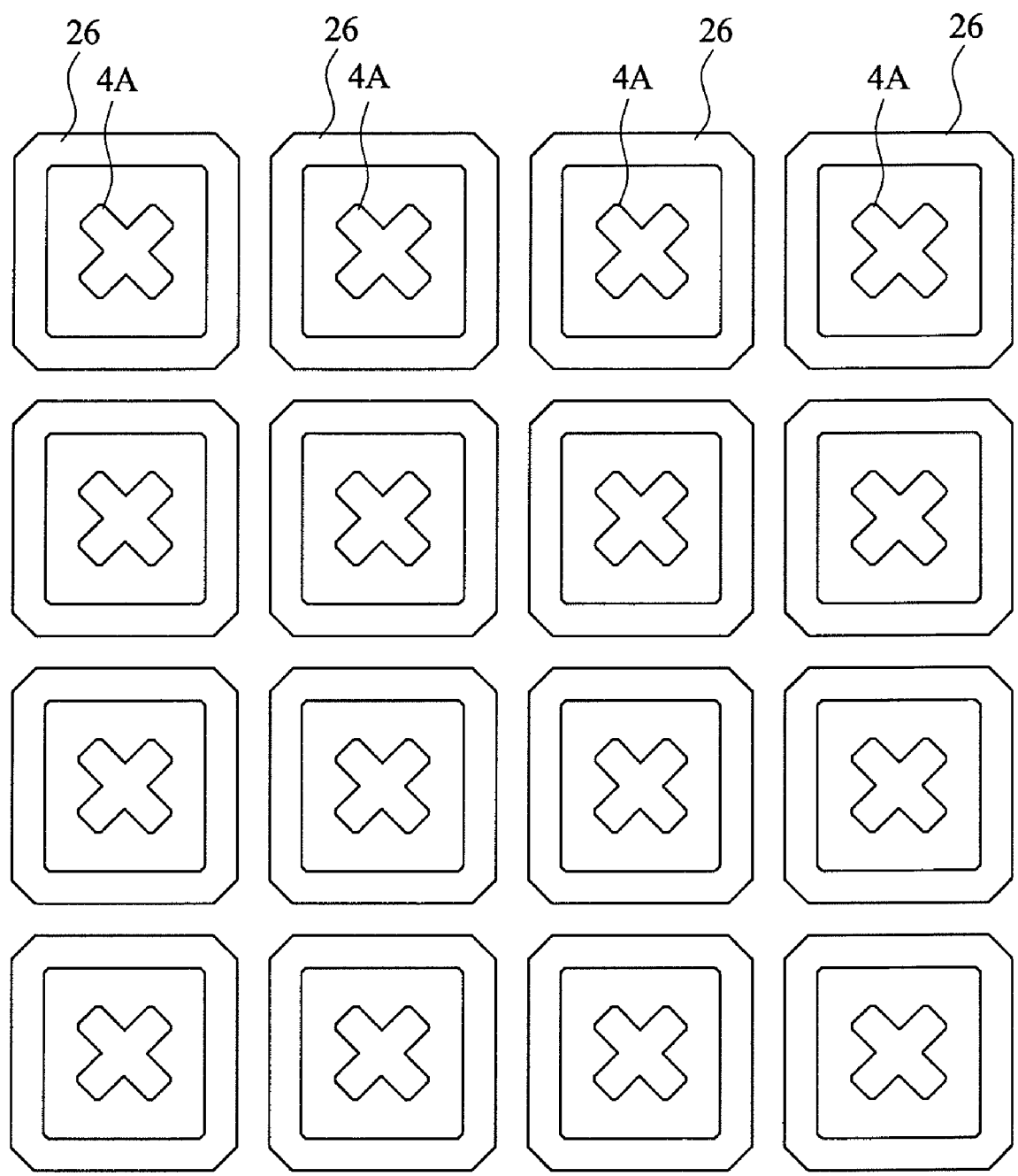
FIG. 20 is a plan view of a principal part of a semiconductor wafer showing another example of a plan-layout of conductive grooves.
Figure 21:
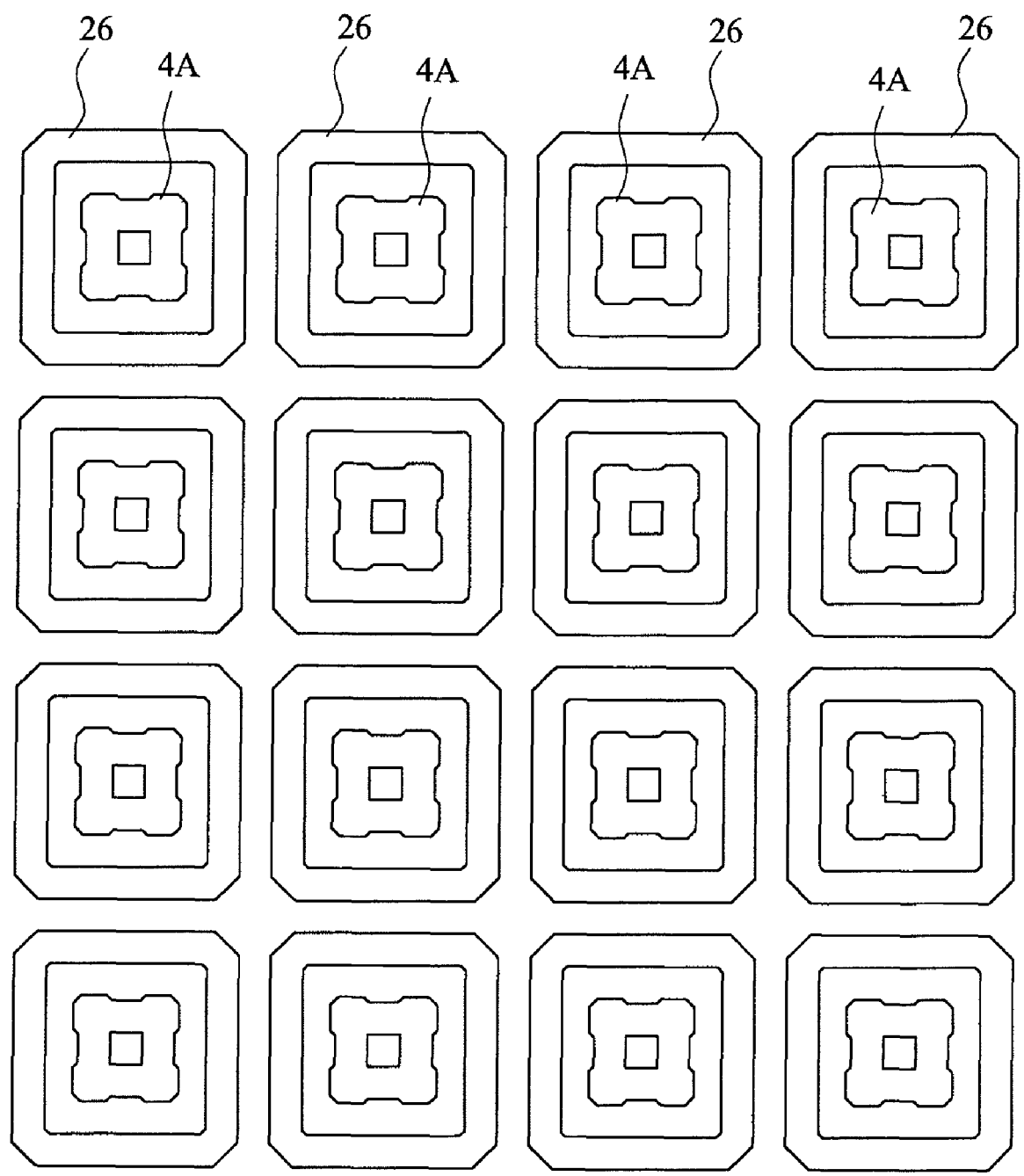
FIG. 21 is a plan view of a principal part of a semiconductor wafer showing another example of a plan-layout of conductive grooves.

FIG. 17 is an example in which the long-sides of the conductive grooves 4A are oriented in four directions mutually shifted by 45 degrees. Also, FIG. 18 is an example in which one conductive groove 4A is arranged on the inner part of each insulation groove 26 in a state where the long-sides are oriented in two directions (the X direction and the Y direction) mutually shifted by 90 degrees. In these cases, when the number of the conductive grooves 4A directed in each direction is made to be approximately equal to each other in the entire wafer W2, the warpage of the wafer W2 can be suppressed. In addition, in the cases in which the conductive grooves 4A are oriented in the directions as shown in FIG. 19 to FIG. 21, similar effects can be obtained.

Figure 22:
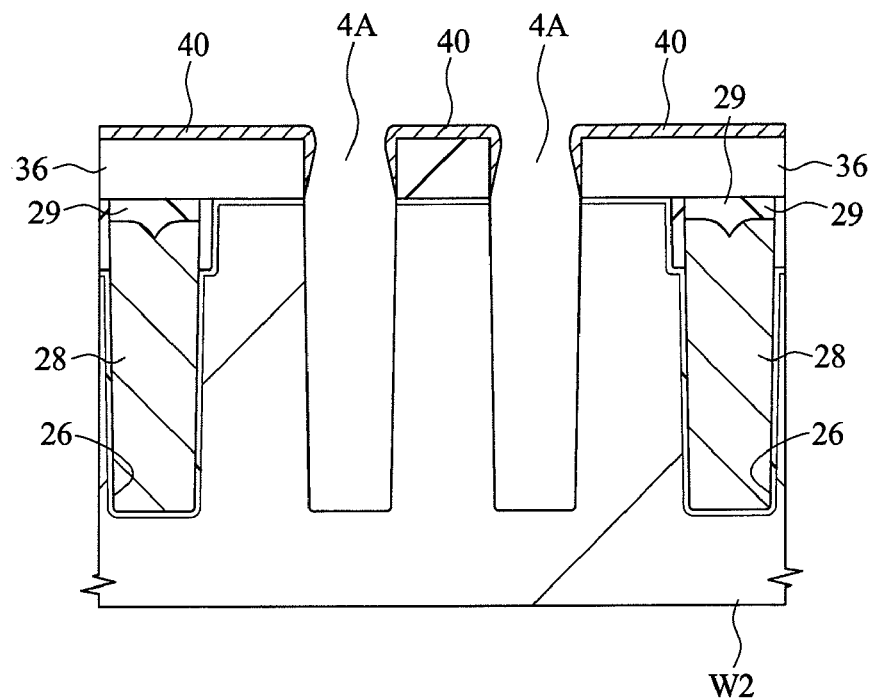
FIG. 22 is an enlarged cross sectional view of a principal part of the semiconductor wafer for showing a manufacturing step of the semiconductor device continued from FIG. 14.

Next, a conductive film containing tungsten (W) as a primary component is embedded inside the conductive groove 4A by using a method described below. First of all, as shown in FIG. 22, a titanium nitride (TiN) film 40 having a film thickness of about 100 nm is deposited on the wafer W2 by a sputtering method. The titanium nitride film 40 has a function of improving the adhesiveness between the silicon oxide film 36 composed of a silicon oxide film and the conductive film. Since the titanium nitride film 40 deposited by the sputtering method has low step coverage (step covering performance), titanium nitride film 40 is practically not deposited inside the conductive groove 4A but mainly deposited on the surface of the silicon oxide film 36 and in the vicinity of the opening of the conductive grooves 4A. The titanium nitride film 40 is deposited to have a comparatively thick film thickness (about 100 nm) since it also functions as an etching stopper when etching back the tungsten film.

Figure 23:
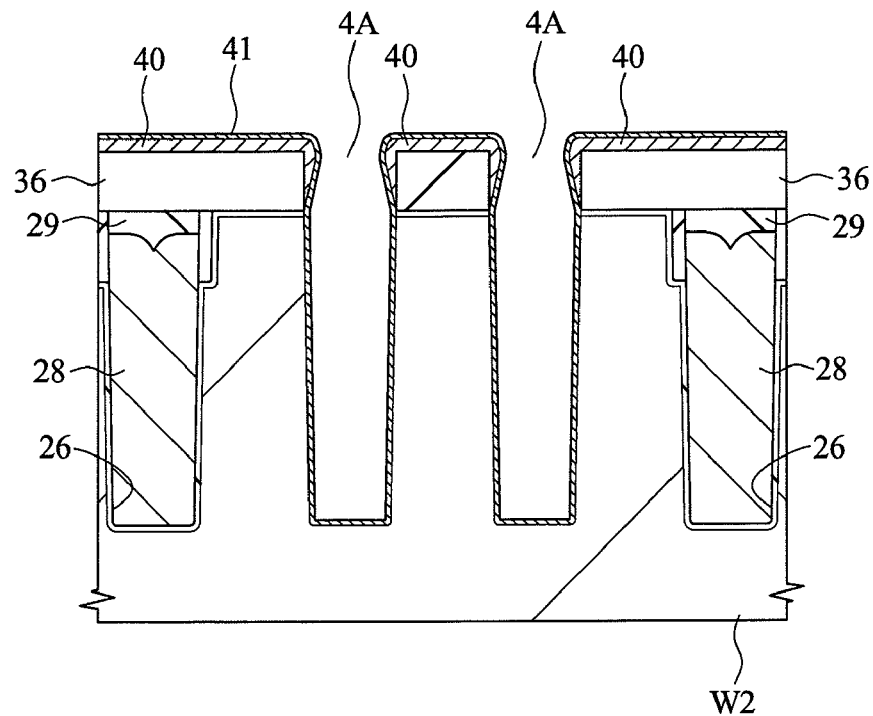
FIG. 23 is an enlarged cross sectional view of a principal part of the semiconductor wafer for showing a manufacturing step of the semiconductor device continued from FIG. 22.

Next, as shown in FIG. 23, a titanium (Ti) film 41 having a film thickness of about 10 to 30 nm is deposited by a CVD method on the surface of the titanium nitride film 40 and the surface of the wafer W2 exposed in the conductive grooves 4A. The titanium film 41 has a function of improving the adhesiveness between the wafer W2 and the conductive film since the titanium film 41 reacts with the wafer W2 (silicon) exposed in the conductive grooves 4A to form a titanium silicide layer in a later thermal treatment step.

Figure 24:
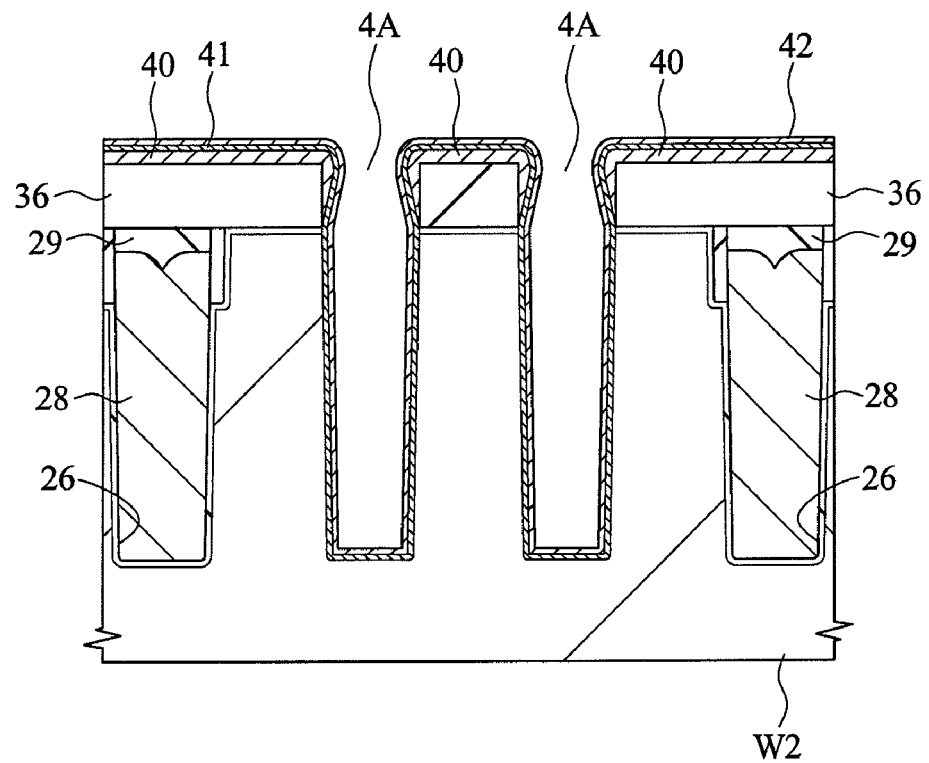
FIG. 24 is an enlarged cross sectional view of a principal part of the semiconductor wafer for showing a manufacturing step of the semiconductor device continued from FIG. 23.

Next, as shown in FIG. 24, a titanium nitride film 42 having a film thickness of about 20 to 30 nm is deposited on the surface of the titanium film 41 by a CVD method. The titanium nitride film 42 has a function of improving the adhesiveness between a tungsten film deposited in a next step and the titanium film 41. Moreover, the titanium nitride film 42 also functions as a barrier layer which prevents a reaction between the tungsten film and the wafer W2 (silicon).

Figure 25:
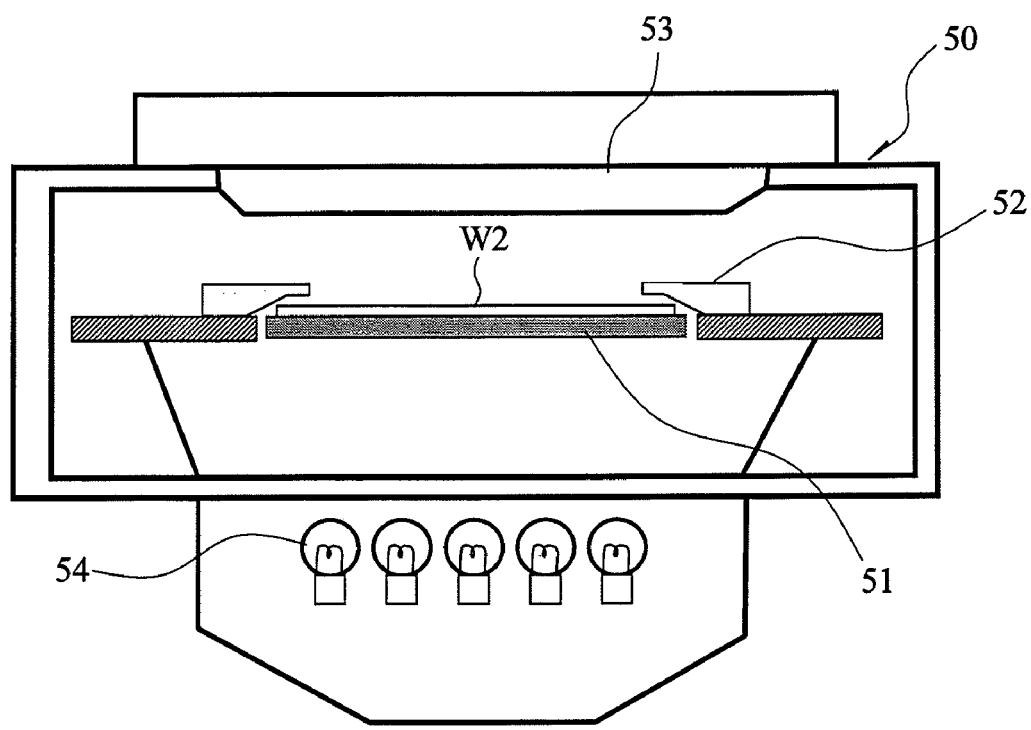
FIG. 25 is a schematic diagram showing a chamber structure of a film formation apparatus.
Figure 26:
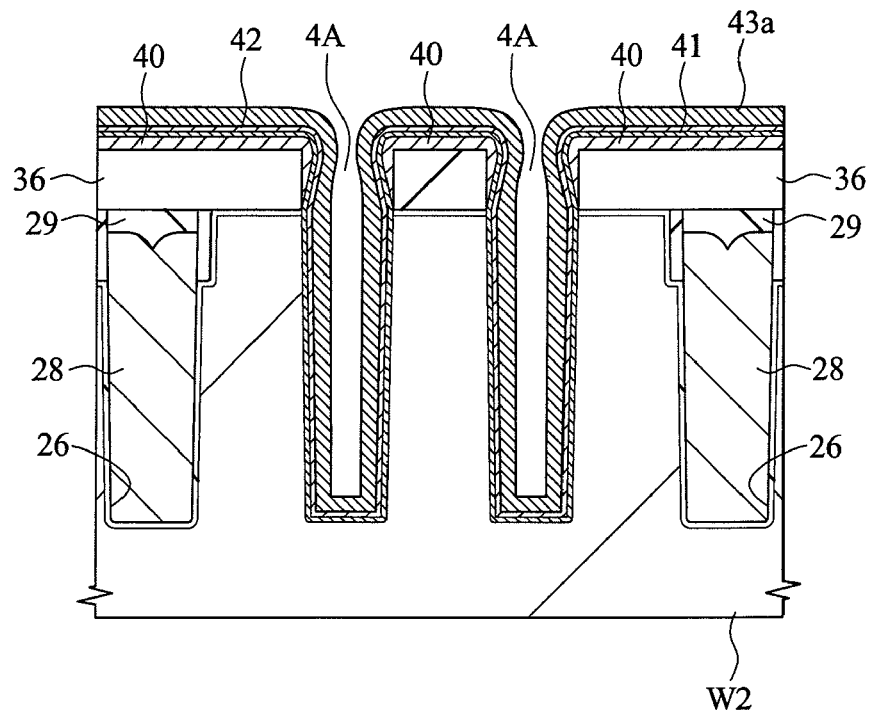
FIG. 26 is an enlarged cross sectional view of a principal part of the semiconductor wafer for showing a manufacturing step of the semiconductor device continued from FIG. 24.

Next, the wafer W2 is inserted in a chamber 50 of a film formation apparatus shown in FIG. 25. In the chamber 50, a susceptor (wafer-holding means) 51 which horizontally holds the wafer W2, a clamp ring (wafer-fixing means) 52 which fixes the wafer W2 held by the susceptor 51, a shower plate 53 which feeds a source gas and an etching gas to the surface of the wafer W2, and the like are provided. Under the chamber 50, lamps 54 which heats the wafer W2 to a desired temperature are provided Next, after the wafer W2 is heated to about 390° C., a source gas ($WF_6$) is fed to the chamber 50 via the shower plate 53, and the source gas is thermally decomposed in the vicinity of the surface of the wafer W2, whereby a tungsten film 43a is deposited on the surface of the titanium nitride film 42 (FIG. 26). In this process, it is preferable that the tungsten film 43a is not completely embedded inside the conductive grooves 4A. More specifically, if the interior of the conductive groove 4A is completely filled in one time of film formation, the film thickness of the tungsten film 43a is increased, whereby the stress generated in the tungsten film 43a by variation in temperature from the film formation step to a next etch back step is increased. As a result, as described above, the tungsten film 43a causes exfoliation and microcracks, and the wafer W2 causes warpage or cracks. As described above, in the present embodiment, in order to reduce the stress generated in the tungsten film 43a, the opening shape of the conductive groove 4A is made to be rectangular. Furthermore, in order to reduce the warpage of the wafer W2, the number of the conductive grooves 4A whose long-sides are directed in the Y direction and the number of the conductive grooves 4A whose long-sides are directed in the X direction are made to be approximately equal to each other in the entire wafer W2.

Figure 27:
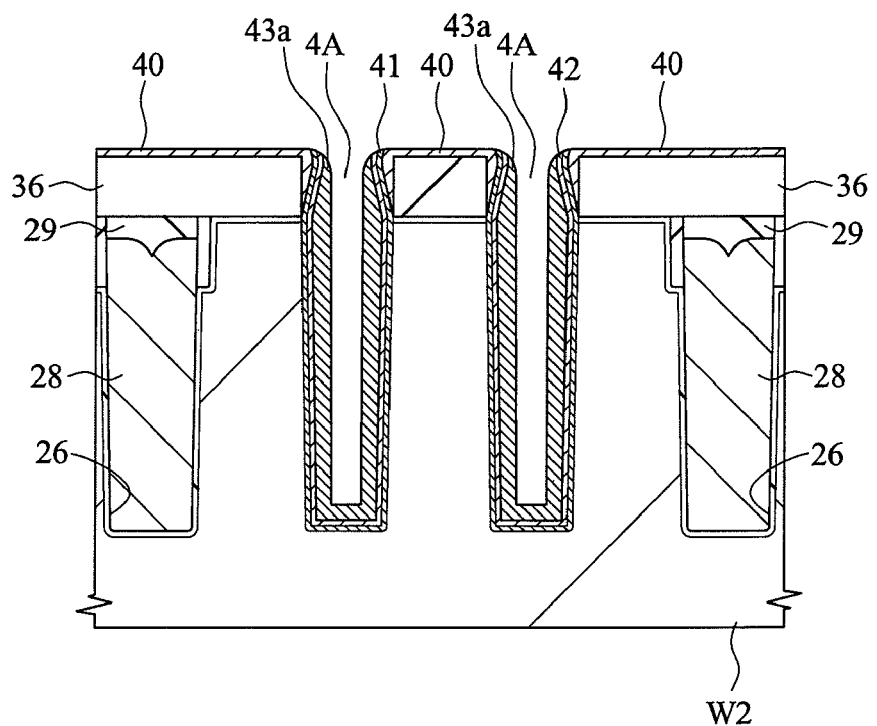
FIG. 27 is an enlarged cross sectional view of a principal part of the semiconductor wafer for showing a manufacturing step of the semiconductor device continued from FIG. 26.

Next, as shown in FIG. 27, the tungsten film 43a outside of the conductive grooves 4A is removed by etch back. This etch back is performed by feeding an etching gas ($SF_6$) to the surface of the wafer W2 and applying RF in a dry etch apparatus. This etch back is performed by using the titanium nitride film 40 covering the surface of the silicon oxide film 36 as an etching stopper so that the titanium nitride film 40 is not completely removed. In the case where the titanium nitride film 40 is completely removed and the surface of the silicon oxide film 36 is exposed, when a tungsten film is deposited at the next time, exfoliation readily occurs on the interface between the silicon oxide film 36 and the tungsten film.

Figure 28:
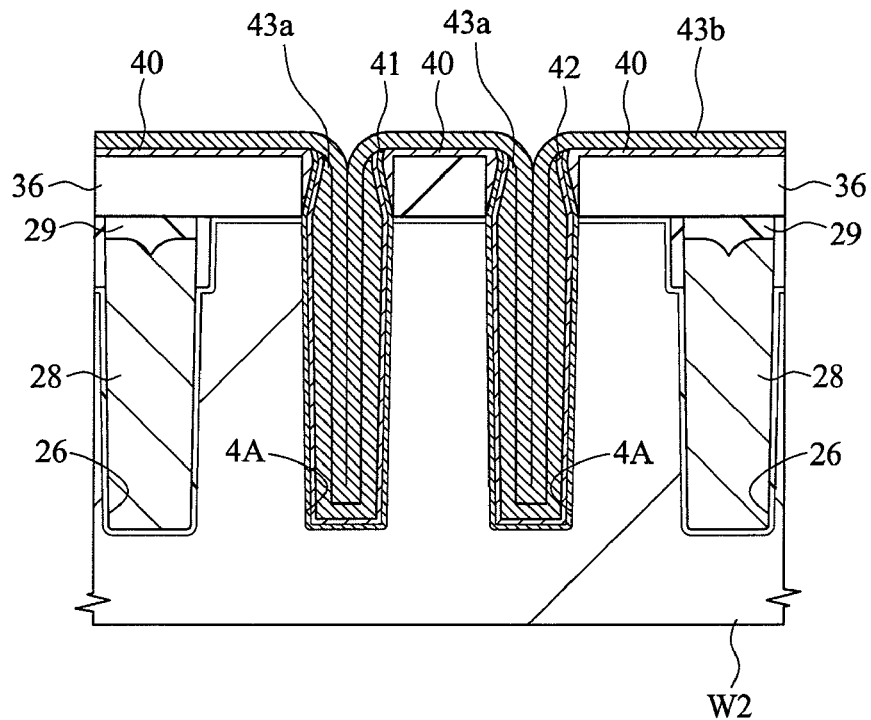
FIG. 28 is an enlarged cross sectional view of a principal part of the semiconductor wafer for showing a manufacturing step of the semiconductor device continued from FIG. 27.

Next, the wafer W2 held by the susceptor 51 is heated again, and a source gas ($WF_6$) is fed to the chamber 50 via the shower plate 53 to deposit a tungsten film 43b (FIG. 28). Thus, the two layers of the tungsten films 43a and 43b are approximately completely embedded inside the conductive grooves 4A.

Figure 29:
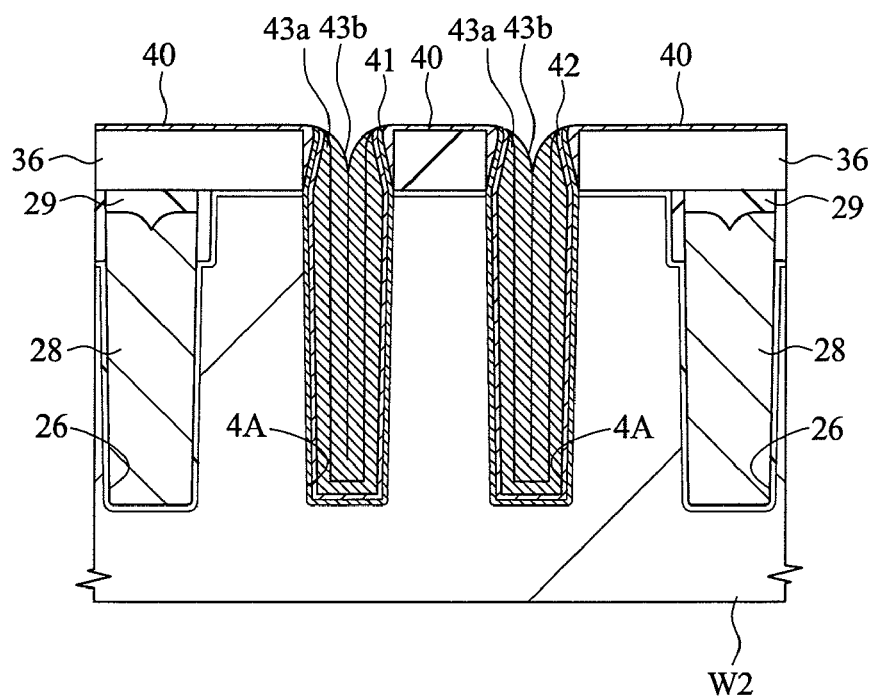
FIG. 29 is an enlarged cross sectional view of a principal part of the semiconductor wafer for showing a manufacturing step of the semiconductor device continued from FIG. 28.
Figure 30:
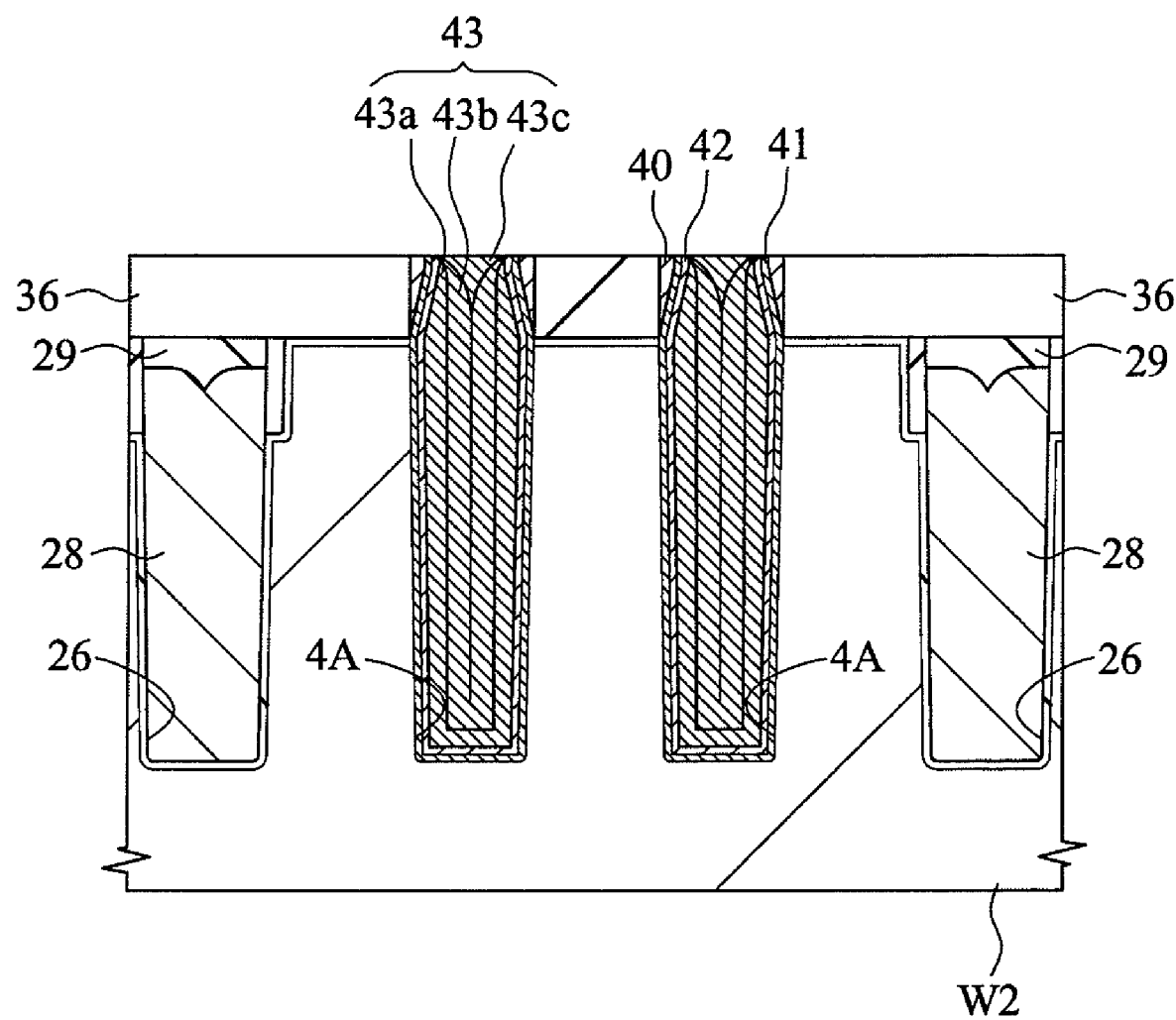
FIG. 30 is an enlarged cross sectional view of a principal part of the semiconductor wafer for showing a manufacturing step of the semiconductor device continued from FIG. 29.

Next, the etching gas ($SF_6$) is fed to the surface of the wafer W2 and RF is applied in the dry etch apparatus, whereby the tungsten film 43b outside of the conductive grooves 4A is removed by etch back (FIG. 29). When this etch back is performed, the tungsten film 43b in the conductive grooves 4A is also etched back, and the surface thereof recedes downward. Then, a tungsten film 43c is further deposited in the chamber 50, and the tungsten film 43c and the titanium nitride 40 outside of the conductive grooves 4A are subsequently removed by etch back, thereby embedding the tungsten film 43 (43a, 43b, 43c) in the conductive grooves 4A (FIG. 30).

When the tungsten film 43 is embedded in the conductive grooves 4A by repeating deposition and etch back at a plurality of times in the above-described manner, the film thickness of the tungsten film 43 (43a, 43b, 43c) deposited in one film formation step can be made to be thin, therefore, such problems that generation of exfoliation and micro-cracks of the tungsten film 43 and warpage and cracking of the wafer W2 can be reliably avoided. Note that, although the deposition and etch back of the tungsten film 43 are repeated three times in the above explanation, the deposition and etch back of the tungsten film 43 may be repeated four times or more so as to further reduce the thickness of the tungsten film 43 deposited in one film formation step.

Also, as another method, there is a method in which film formation and etch back of the tungsten film 43a is sequentially performed in the same chamber 50. Since the stress generated in the tungsten film 43a due to variation in temperature immediately after the film formation can be reduced, warpage of the wafer W2 can be reliably reduced. Moreover, since the wafer is fixed by the clamp ring 52 during the film formation, warpage thereof is suppressed. This etch back is performed by feeding an etching gas ($ClF_3$ or $NF_3$) to the surface of the wafer W2 held by the susceptor 51 of the chamber 50. Since this etch back is performed by using the titanium nitride film 40 covering the surface of the silicon oxide film 36 as an etching stopper, the titanium nitride film 40 has not be completely removed. The etch back of the tungsten film 43a is desired to be performed before the temperature of the tungsten film 43a is lowered to normal temperature. During the beginning of the film formation to the completion of the etch back, the wafer W2 is desired to be reliably fixed by the clamp ring 52.

Thereafter, the tungsten film and the titanium nitride film 40 on the surface are removed by CMP polishing method.

Figure 31:
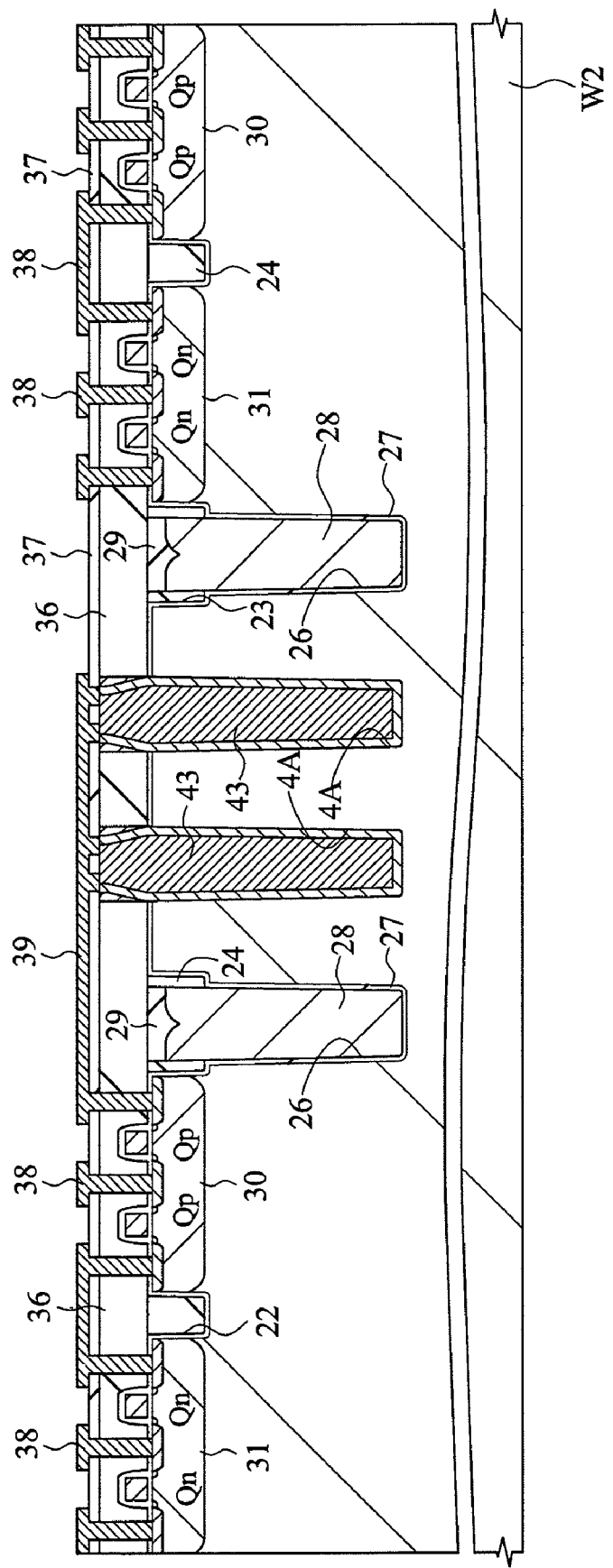
FIG. 31 is an enlarged cross sectional view of a principal part of the semiconductor wafer for showing a manufacturing step of the semiconductor device continued from FIG. 30.

Next, as shown in FIG. 31, after a silicon oxide film 37 is formed on the silicon oxide film 36 by a CVD method, first-layer aluminum (Al) wirings 38 connecting the n-channel-type MOS transistors Qn to the p-channel-type MOS transistors Qp are formed on the silicon oxide film 37. Moreover, at the same time, first-layer aluminum wirings 39 connecting the tungsten film 43 inside the conductive grooves 4A to part of the MOS transistors (for example, p-channel-type MOS transistor Qp) are formed. In order to form the first-layer aluminum wirings 38 and 39, an aluminum alloy film is deposited on the silicon oxide film 37 by a sputtering method, and then the aluminum alloy film is patterned by dry etching using a photo-resist film (not shown) as a mask.

Figure 32:
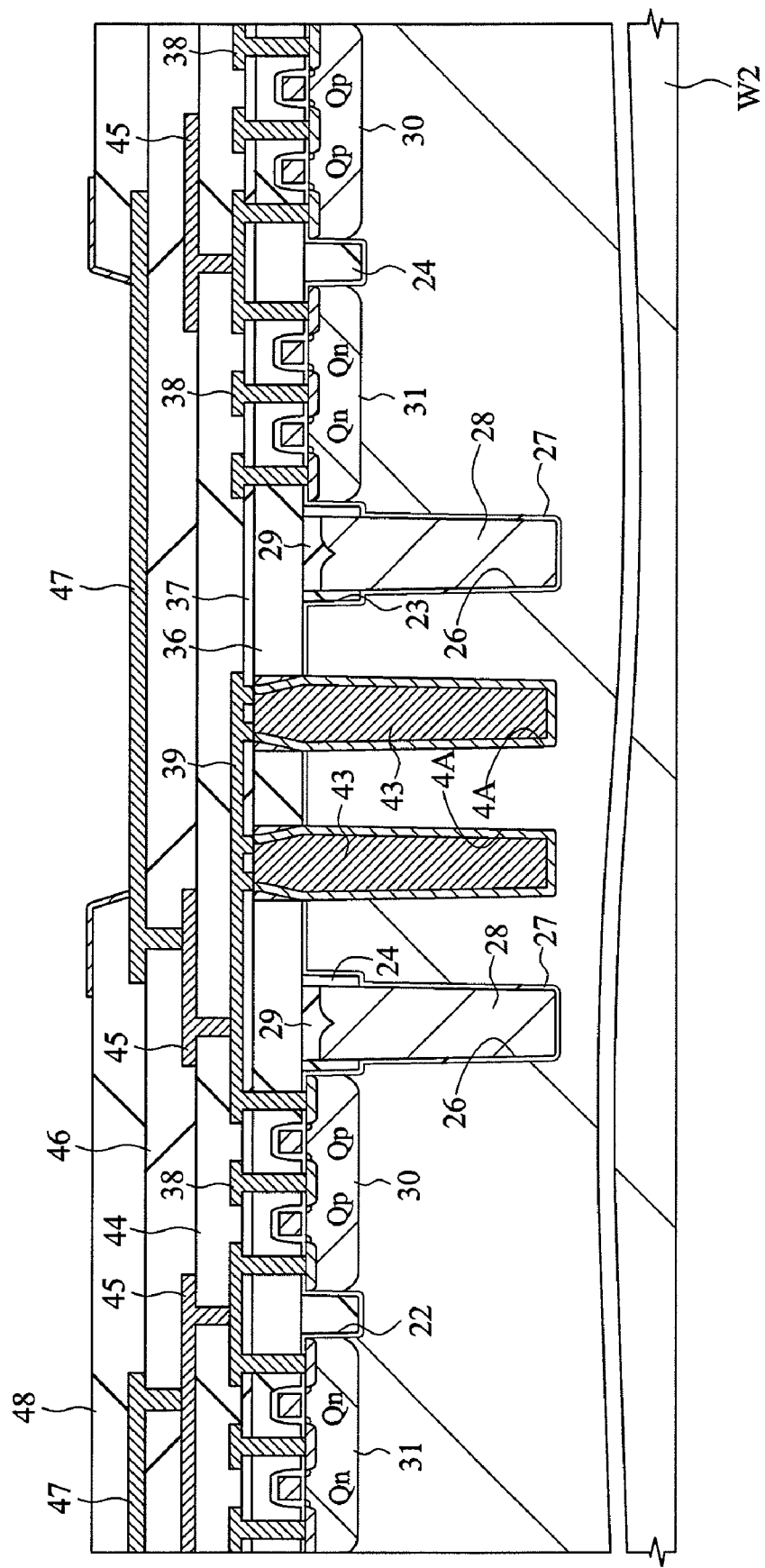
FIG. 32 is an enlarged cross sectional view of a principal part of the semiconductor wafer for showing a manufacturing step of the semiconductor device continued from FIG. 31.

Next, as shown in FIG. 32, on the upper layer of the first aluminum wirings 38 and 39, a first interlayer insulation film 44 composed of a silicon oxide film, second-layer aluminum wirings 45, a second interlayer insulation film 46 composed of a silicon oxide film, third-layer aluminum wirings 47, and a surface protective film 48 composed of a stacked film made of a silicon oxide film and a silicon nitride film are sequentially formed.

Thereafter, mutually different integrated circuits are formed on the other two wafers (W1, W3) in a similar method as described above. Then, after the three wafers W1, W2, and W3 are stacked and attached to each other by using a known method, the wafers W1, W2, and W3 are diced and separated into individual chips C1, C2, and C3 having three-dimensional structures. When they are mounted on the wiring substrate 1 and sealed by the mold resin 2, the package shown in FIG. 1 is completed.

Hereinabove, the invention made by the present inventor has been described concretely according to the embodiments. However, the present invention is not limited to the above described embodiments, and it goes without saying that various modifications can be made without departing from the gist thereof.

INDUSTRIAL APPLICABILITY

The present invention can be applied to a semiconductor device having a three-dimensional structure in which a plurality of chips are stacked and attached to each other.

The invention claimed is:

1. A method of manufacturing a semiconductor device having a process of embedding a conductive film mainly composed of tungsten inside a groove formed in a silicon wafer and a silicon oxide film on the silicon wafer, the method comprising the steps of:
   (a) depositing a first titanium nitride film covering at least a surface of the silicon oxide film by a sputtering method after forming the groove in the silicon wafer and the silicon oxide film on the silicon wafer;
   (b) depositing a titanium film covering a surface of the first titanium nitride film and a surface of the silicon wafer exposed inside the groove and having a film thickness equal to or less than half of a diameter of the groove;
   (c) depositing a second titanium nitride film covering a surface of the titanium film and having a total film thickness of the second titanium nitride film and the titanium film equal to or less than half of the diameter of the groove; and
   (d) depositing a tungsten film to be embedded inside of the groove after the step (c).

2. The method of manufacturing the semiconductor device according to claim 1,
   wherein the step (d) is performed by alternately repeating the deposition of the tungsten film and etch back of the tungsten film outside of the groove at a plurality of times.

3. The method of manufacturing the semiconductor device according to claim 1,
   wherein the titanium film, the second titanium nitride film, or the tungsten film is deposited by a CVD method.

4. The method of manufacturing the semiconductor device according to claim 1,
   wherein an aspect ratio of the groove is larger than or equal to 20.

5. The method of manufacturing the semiconductor device according to claim 2,
   wherein the etch back of the tungsten film is performed by using the first titanium nitride film covering the surface of the silicon oxide film as a stopper of etching.

6. The method of manufacturing the semiconductor device according to claim 2,
   wherein the step (d) uses a manufacturing apparatus having a chamber including wafer-holding means for holding the silicon wafer in a heated state and a wafer-fixing means for fixing the silicon wafer held by the wafer-holding means, and
   the deposition of the tungsten film and the etch back of the tungsten film are successively performed in the chamber.

7. The method of manufacturing the semiconductor device according to claim 5,
   wherein a film thickness of the first titanium nitride film outside of the groove is larger than each film thickness of the titanium film and the second titanium nitride film.

8. The method of manufacturing the semiconductor device according to claim 6,
   wherein the deposition of the tungsten film and the etch back of the tungsten film are successively performed in a state where the silicon wafer is held by the wafer-holding means.

9. The method of manufacturing the semiconductor device according to claim 6,
   wherein, after the tungsten film is deposited in a state where the silicon wafer is heated, the etch back of the tungsten film is performed before a surface temperature of the silicon wafer returns to normal temperature.

10. A method of manufacturing a semiconductor device including a process of embedding a conductive film inside of a groove formed in a silicon wafer and an insulating film on the silicon wafer, the method comprising the steps of:
    (a) forming a first adhesive layer having a higher adhesiveness to the insulating film than that of the conductive film so as to cover at least a surface of the insulating film after forming the groove in the silicon wafer and the insulating film on the silicon wafer;
    (b) after the step (a), forming a second adhesive layer having a higher adhesiveness to the silicon wafer than that of the conductive film and having a film thickness equal to or less than half of a diameter of the groove so as to cover at least a surface of the silicon wafer exposed inside the groove;
    (c) forming a barrier layer having a higher adhesiveness to the conductive film than that of the second adhesive layer and having a function of preventing a reaction between the silicon wafer and the conductive film so as to cover a surface of the second adhesive layer and to make a total film thickness of the barrier layer and the second adhesive layer to be equal to or less than half of the diameter of the groove; and
    (d) after the step (c), forming the conductive film to be embedded inside the groove.

11. The method of manufacturing the semiconductor device according to claim 10,
    wherein the step (d) is performed by alternately repeating the deposition of the conductive film and etch back of the tungsten film outside of the groove at a plurality of times.

12. The method of manufacturing the semiconductor device according to claim 11,
    wherein the deposition of the conductive film and the etch back of the tungsten film outside of the groove are successively performed in a chamber of a manufacturing apparatus, the chamber includes a wafer-holding means for holding the silicon wafer in a heated state and a wafer-fixing means for fixing the silicon wafer held by the wafer-holding means, and after the conductive film is deposited in a state where the silicon wafer is heated, the etch back of the conductive film is performed before a surface temperature of the silicon wafer returns to normal temperature.

13. The method of manufacturing the semiconductor device according to claim 11,
    wherein the insulating film is an insulating film mainly composed of silicon oxide, the first adhesive layer is a titanium nitride film deposited by a sputtering method, the second adhesive layer is a titanium film deposited by a CVD method, and the conductive film is a tungsten film deposited by the CVD method.

* * * * *